(12) United States Patent
Satake

(10) Patent No.: US 7,405,515 B2
(45) Date of Patent: Jul. 29, 2008

(54) DISPLAY DEVICE AND METHOD OF MANUFACTURING THE SAME

(75) Inventor: Rumo Satake, Chiba (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 10/939,732

(22) Filed: Sep. 13, 2004

(65) Prior Publication Data

US 2005/0030258 A1 Feb. 10, 2005

Related U.S. Application Data

(62) Division of application No. 10/125,934, filed on Apr. 19, 2002, now Pat. No. 6,798,132.

(30) Foreign Application Priority Data

Apr. 23, 2001 (JP) .............................. 2001-124964

(51) Int. Cl.
*H01J 63/04* (2006.01)
(52) U.S. Cl. ..................... 313/512; 313/498; 313/504
(58) Field of Classification Search ................. 313/498, 313/504
See application file for complete search history.

(56) References Cited

U.S. PATENT DOCUMENTS

| | | | |
|---|---|---|---|
| 5,701,055 A | 12/1997 | Nagayama et al. | ......... 313/504 |
| 5,804,917 A | 9/1998 | Takahashi et al. | |
| 5,952,037 A | 9/1999 | Nagayama et al. | ............ 427/66 |
| 5,962,970 A | 10/1999 | Yokoi et al. | ................. 313/506 |
| 6,013,930 A * | 1/2000 | Yamazaki et al. | ........... 257/353 |
| 6,078,379 A | 6/2000 | Nagae et al. | |
| 6,099,746 A | 8/2000 | Kim | |
| 6,163,055 A * | 12/2000 | Hirakata et al. | ............. 257/347 |

(Continued)

FOREIGN PATENT DOCUMENTS

CN  1211829  3/1999

(Continued)

OTHER PUBLICATIONS

European Search Report re application No. EP 02008325.9, dated Apr. 5, 2006.

(Continued)

*Primary Examiner*—Joseph L. Williams
*Assistant Examiner*—Hana A Sanei
(74) *Attorney, Agent, or Firm*—Cook, Alex, McFarron, Manzo, Cummings & Mehler, Ltd.

(57) ABSTRACT

A display device using an organic light emitting element is provided which is structured so as to ensure excellent display performance by avoiding dot defect and improve long-term reliability. The distance between an organic light emitting element and a sealing substrate is controlled using the top of a bank that is placed in a pixel portion and the top of an insulating film that is placed in a driving circuit portion. As a result, a gap is provided between the organic light emitting element and the sealing substrate and a damage to the organic light emitting element can be avoided. Furthermore, the sealing substrate can be as close to an element substrate as possible, thereby keeping the amount of moisture that enters the display device from its sides small.

14 Claims, 12 Drawing Sheets

U.S. PATENT DOCUMENTS

| | | | |
|---|---|---|---|
| 6,175,186 B1 | 1/2001 | Matsuura et al. | 313/483 |
| 6,204,535 B1* | 3/2001 | Yamazaki et al. | 257/353 |
| 6,274,887 B1 | 8/2001 | Yamazaki et al. | 257/72 |
| 6,359,606 B1 | 3/2002 | Yudasaka | 345/87 |
| 6,554,672 B2 | 4/2003 | Dunham et al. | 445/25 |
| 6,559,594 B2 | 5/2003 | Fukunaga et al. | 313/506 |
| 6,559,595 B1 | 5/2003 | Inoue | 313/506 |
| 6,572,987 B2 | 6/2003 | Seo | 428/690 |
| 6,593,691 B2* | 7/2003 | Nishi et al. | 313/506 |
| 6,706,544 B2* | 3/2004 | Yamazaki et al. | 438/30 |
| 6,717,356 B1 | 4/2004 | Kim | |
| 6,720,198 B2 | 4/2004 | Yamagata et al. | |
| 6,992,439 B2 | 1/2006 | Yamazaki et al. | |
| 7,115,434 B2 | 10/2006 | Yamazaki et al. | |
| 7,264,979 B2 | 9/2007 | Yamagata et al. | |
| 7,279,194 B2 | 10/2007 | Hiroki et al. | |
| 7,301,279 B2 | 11/2007 | Sakakura et al. | |
| 2001/0023661 A1* | 9/2001 | Hiroki et al. | 118/300 |
| 2002/0048829 A1* | 4/2002 | Yamazaki et al. | 438/16 |
| 2002/0113248 A1 | 8/2002 | Yamagata et al. | |
| 2002/0153831 A1 | 10/2002 | Sakakura et al. | |
| 2002/0180371 A1 | 12/2002 | Yamazaki et al. | |
| 2003/0017360 A1* | 1/2003 | Tai et al. | 428/690 |
| 2005/0012445 A1 | 1/2005 | Yamazaki et al. | |

FOREIGN PATENT DOCUMENTS

| | | |
|---|---|---|
| EP | 0 884 930 A1 | 12/1998 |
| EP | 0 917 410 | 5/1999 |
| EP | 0 961 525 A1 | 12/1999 |
| EP | 0 999 595 A2 | 5/2000 |
| GB | 2 297 647 A | 8/1996 |
| JP | 08-202287 | 8/1996 |
| JP | 08-315981 | 11/1996 |
| JP | 09-102393 | 4/1997 |
| JP | 09-134787 | 5/1997 |
| JP | 2000-173766 | 6/2000 |

OTHER PUBLICATIONS

Office Action, Chinese Patent Application No. 02118164.0, dated Jan. 12, 2007.

* cited by examiner

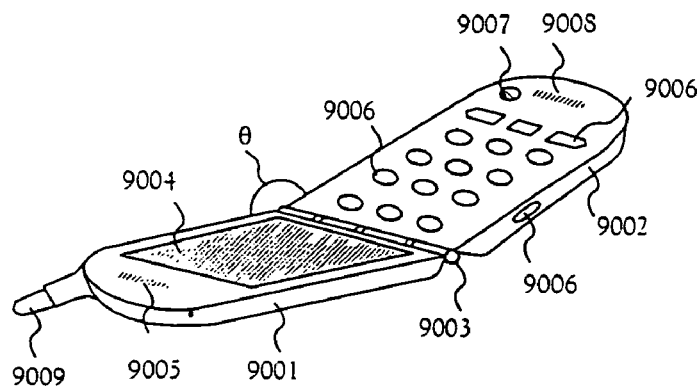
FIG. 9A
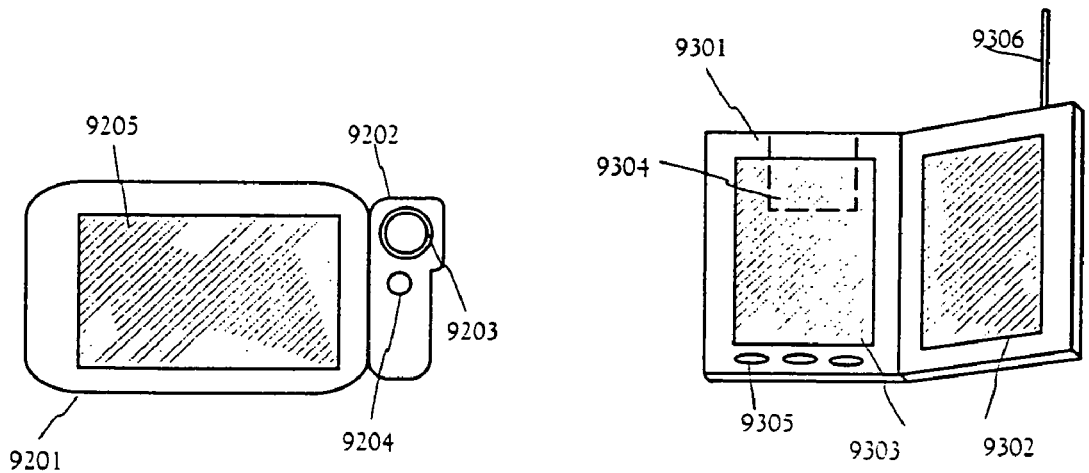
FIG. 9B
FIG. 9C
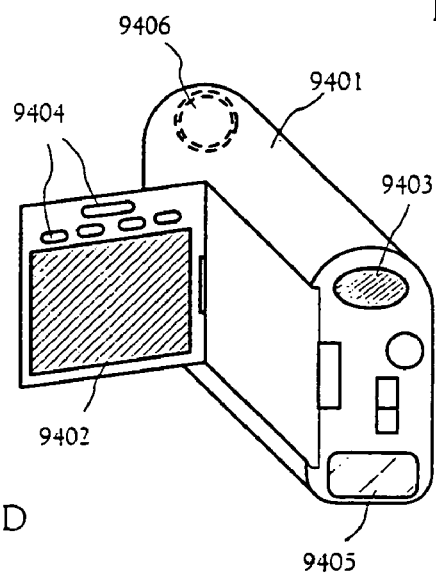
FIG. 9D

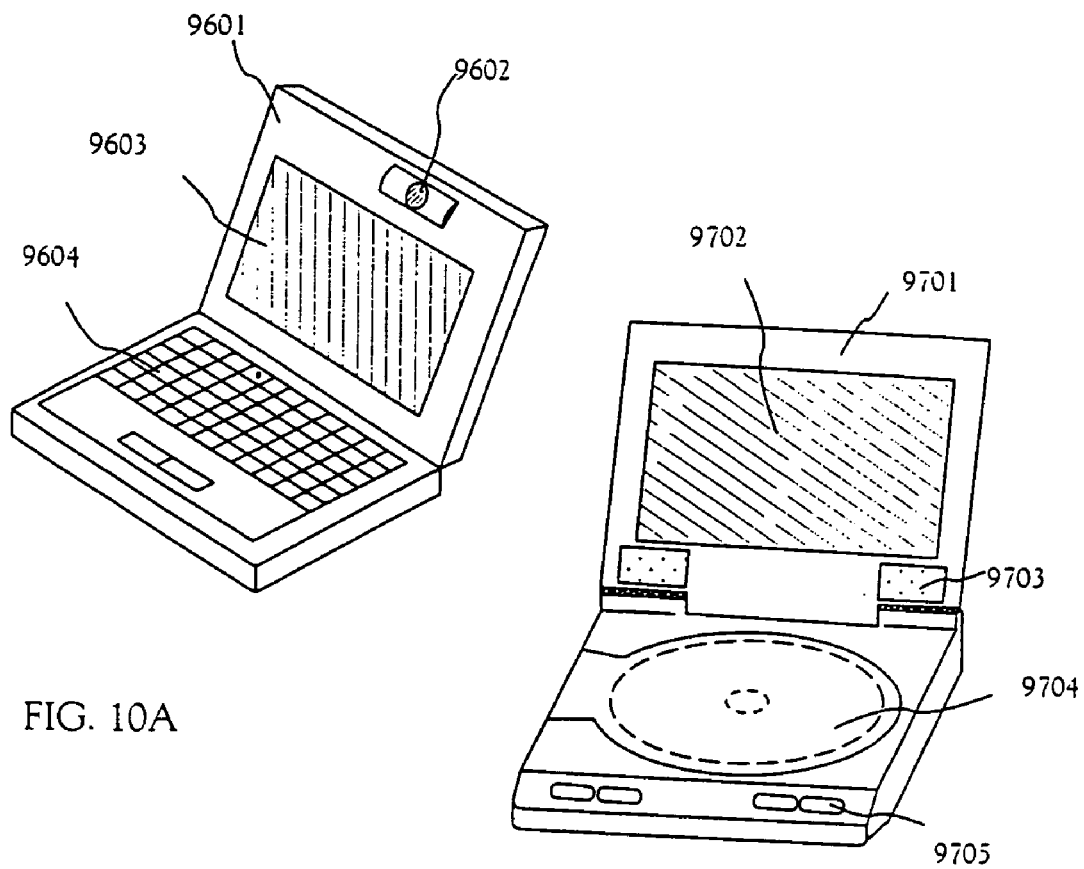
FIG. 10A
FIG. 10B
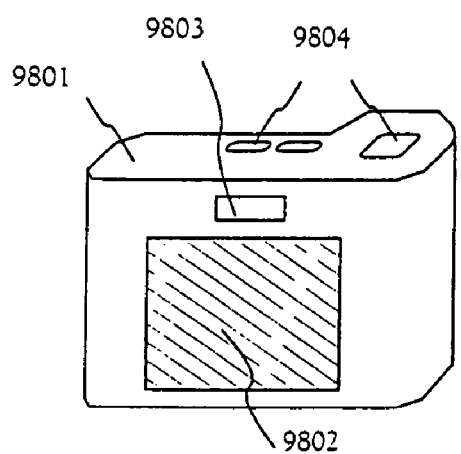
FIG. 10C

DISPLAY DEVICE AND METHOD OF MANUFACTURING THE SAME

This application is a divisional of U.S. application Ser. No. 10/125,934, filed on Apr. 19, 2002 now U.S. Pat. No. 6,798,132.

BACKGROUND OF THE INVENTION

1. Field of the Invention

The present invention relates to a display device using an organic light emitting element and a method of manufacturing the same. Specifically, the present invention relates to a display device and its manufacturing method in which an element substrate with an organic light emitting element formed thereon and a sealing substrate are placed close to each other with the sealing substrate opposing the element substrate in order to seal the organic light emitting element.

2. Description of the Related Art

Display devices using organic light emitting elements have been researched in recent years. A display device in which a pixel portion is composed of organic light emitting elements is self-luminous and, unlike liquid crystal display devices, does not need a light source such as back light. Therefore the use of organic light emitting elements is deemed as promising means to reduce weight and thickness of display devices and this type of display devices are expected to be used in cellular phones, personal portable information terminals (personal digital assistant: PDA), and the like.

Organic light emitting elements are luminous bodies which have a diode structure with an organic compound layer sandwiched between two electrodes and which emit light by combining electrons injected from one of the electrodes with holes injected from the other electrode in the organic compound layer. One of organic light emitting elements is an organic light emitting diode (OLED).

FIG. 12 is a sectional view showing a conventional active matrix display device that uses an organic light emitting element. Substrates 300 and 311 are transmissive of light. Of these substrates, the one that has an organic light emitting element is called an element substrate. An organic light emitting element 313 is composed of a pixel electrode 303, an organic compound layer 304, and an opposite electrode 305. The pixel electrode of the organic light emitting element is in contact with the top face of an interlayer insulating film 302, with inner walls of a contact hole that pierces the interlayer insulating film to reach a control circuit 301, and with the top of the control circuit. The control circuit 301 is composed of TFTs (thin film transistors), and has a switching TFT and a current controlling TFT. The switching TFT switches between conductive and unconductive in accordance with an output of a driving circuit. The current controlling TFT is applied a voltage according to an output of a driving circuit to the pixel electrode 303 so that a current flows between the opposite electrode and the pixel electrode. The intensity of light emitted from the organic compound layer 304 is dependent on the amount of current flowing between the pixel electrode and the opposite electrode.

A sealing substrate 312 is placed so as to face the element substrate, and is bonded using a seal member 306. When the pixel electrode is reflective of light whereas the opposite electrode is transmissive of light, emitted light travels upward in the sectional view and is visible through the light-transmissive sealing substrate. Since light emitted from the organic light emitting element can be taken out from the opposite side of the TFTs, display of high luminance and definition can be obtained irrespective of the aperture ratio of pixels.

If the display device is to display color images, a white light emitting diode is combined with a color filter. In this case, the sealing substrate has the color filter and the sealing substrate is bonded to the element substrate using the seal member. The sealing substrate is composed of the substrate 311, the color filter, and light-shielding portions 307. The color filter may be in contact with the white light emitting diode. The color filter is composed of a first spectroscope filter 308, a second spectroscope filter 309, and a third spectroscope filter 310. Each spectroscope filter transmits one of red light, blue light, and green light for a color display using three primary colors in an additive color mixing manner. The light-shielding portions 307 are provided in gaps between the spectroscope filters to block light. This structure is disclosed in Japanese Patent Application Laid-open No. 2000-173766, for example.

Development of display devices using organic light emitting elements is advanced to obtain higher image quality by high luminance and color display as above. However, evaporation is used to form the organic compound layer and it is therefore difficult to deposit the layer at projections caused by wiring lines of the TFTs or the like and on side walls of the pixel electrode. If the continuity of the organic compound layer is broken at the projections or other places, short circuit of the pixel electrode and the opposite electrode is caused at that wiring breakage point to form a pixel that cannot emit light because no electric field is applied to its organic light emitting layer.

To counter this, a structure has been proposed in which a patterned insulating layer or an electric-insulating partition wall (hereinafter referred to as bank) is provided between pixel electrodes. In order to prevent dot defect due to a pixel that cannot emit light, a structure is proposed in which an insulating film is placed so as to cover the projections caused by the TFTs as well as the edges of the pixel electrode, and then the organic compound layer and the opposite electrode are formed on the top face of the insulating film and along the gently-sloped side faces of the insulating film. This structure is disclosed in, for example, Japanese Patent Application Laid-open No. Hei 9-134787. There is an overhanging hank with its top protruding further than its bottom. The structure that includes the overhanging bank is disclosed in Japanese Patent Application Laid-open Nos. Hei 8-315981 and Hei 9-102393, for example.

Still, there are problems remained unsolved in manufacturing a display device that uses an organic light emitting element.

For instance, the above-described structure of Japanese Patent Application Laid-open No. Hei 12-173766, where the sealing substrate is in contact with the organic light emitting element, is under fear of wiring breakage of the organic light emitting element when there is a hard foreign matter or a scratch on the sealing substrate. Then the opposite electrode and the pixel electrode short-circuit through the organic compound film to create a pixel that cannot emit light and lower the yield.

The foreign matter that often causes the wiring breakable is a hard one out of dust clung to the sealing substrate even after it is washed and dust mixed in during manufacture of the color filter. In some cases, dust in the interior of the apparatus or in the surroundings settles on the organic light emitting element in the manufacturing process of the element substrate.

The wiring breakage often takes place when the seal member is cured between the element substrate and the sealing substrate to bond the two substrates. A large pressure vertical to the substrate planes is applied when bonding the substrates. Therefore, if there is hard dust on the organic light emitting element, a large force is locally applied to cause the wiring breakage of the organic light emitting element. Furthermore, the organic light emitting element is damaged by shear stress when a pressure parallel to the substrate planes is applied during bonding and there is a hard projecting dust. Accordingly, an idea for avoiding the wiring breakage due to dust is to allow a gap between the organic light emitting element and the sealing substrate so that the element does not touch the sealing substrate.

However, when the gap between the organic light emitting element and the sealing substrate is wide, it makes it easy for moisture and oxygen to enter the display device from the sides thereof. The front and back of the display device, which are substrates formed of glass of inorganic materials or a metal, allow little steam and oxygen to transmit and therefore almost no moisture and oxygen enter the display device from its front and back. On the other hand, the seal member formed of an organic resin is provided on the sides of the display device between the substrates. Since the seal member has high moisture permeability, the amount of moisture that enters the sealed space through the seal member is too large to ignore. Accordingly, it is better if the height of the display device in section, excluding the thicknesses of the substrates, is smaller.

Smaller height is preferred because moisture oxidizes the cathode of the organic light emitting element or causes peeling of the organic compound layer off the cathode to generate dark spots (pixels that cannot emit light) and lower the display quality considerably. A dark spot is a progressive defect and it is said that it progresses even when the organic light emitting element is not in operation. This is because the cathode is formed of AlLi, MgAg, or the like, and alkaline metal or alkaline-earth metal contained in the cathode is highly reactive to moisture.

However, if the sealing substrate is placed above the organic light emitting element with a gap, there is no means to control the distance between the organic light emitting element and the sealing substrate to make the distance nonuniform throughout the display region. In the display device that takes out light emitted from the organic light emitting element from the sealing substrate side, the nonuniform distance between the substrates causes interference fringes to lower the visibility.

To summarize, when the contact between the organic light emitting element and the sealing substrate is coupled with the presence of a hard projecting foreign matter, wiring breakage of the organic light emitting element takes place to lower the yield. When the organic light emitting element is spaced apart from the sealing substrate, on the other hand, there is a problem of an increased amount of moisture entering the display device from the sides thereof, which accelerates degradation of the organic light emitting element. The organic light emitting element spaced apart from the sealing substrate can cause another problem of uneven brightness due to interference in the structure where light emitted from the organic light emitting element is taken out from the sealing substrate side.

SUMMARY OF THE INVENTION

The present invention has been made in view of the above, and an object of the present invention is therefore to provide a display device capable of improving the yield and preventing degradation of an organic light emitting element and to provide a method of manufacturing the display device. Another object of the present invention is to provide a display device and its manufacture method capable of improving the yield, preventing degradation of an organic light emitting element, and enhancing the uniformity in luminance when light emitted from the organic light emitting element is taken out from the sealing substrate side.

Specifically, an object of the present invention is to place an element substrate and a sealing substrate close to each other to reduce the amount of moisture that enters the display device from a gap between the element substrate and the sealing substrate.

Another object of the present invention is to provide a display device and its manufacture method capable of preventing a damage to an organic light emitting element from foreign matters on the organic light emitting element and on the sealing substrate opposing the organic light emitting element.

Still another object of the present invention is to provide a display device and its manufacture method capable of holding an element substrate and a sealing substrate at a uniform distance to improve the uniformity of the gap.

In the present invention, an element substrate has a pixel electrode, a bank that covers the edge of the pixel electrode, an organic compound layer, and an opposite electrode. The organic compound layer and the opposite electrode are placed only along the side faces among the surfaces of the bank, and they are not formed on the top of the bank. The sealing substrate is in contact with the top of the bank. The element substrate and the sealing substrate are bonded using a seal member.

When the organic light emitting element is separated from the sealing substrate by the bank, the bank keeps hard dust on the sealing substrate from contacting the organic light emitting element. Therefore the organic light emitting element is not damaged and the yield is improved. In addition, the distance between the organic light emitting element and the sealing substrate is maintained by the bank densely formed in the pixel portion when a high pressure is applied to the entire surfaces of the element substrate and sealing substrate during bonding. Therefore, contact between the organic light emitting element and the sealing substrate as well as contact between the organic light emitting element and a projecting foreign matter on the sealing substrate can be avoided.

The bank keeps the distance between the organic light emitting element and the sealing substrate uniform. Accordingly, coherent light, which is reflected at the interface of the sealing substrate and the interface of the organic light emitting element to interfere, has a constant intensity and the luminance of a displayed image can obtain improved uniformity.

Furthermore, the height of the display device in section, excluding the thicknesses of the substrates can be kept small since the bank holds the element substrate and the opposite substrate at a distance. This prevents degradation reaction of the organic light emitting element due to moisture that enters the display device from its sides.

In the present invention, an insulating film may be formed at the same time the bank is formed to place the insulating film between the seal member and the pixel portion. The top of insulating film is in contact with the sealing substrate. In short, the top of the bank and the top of the insulating film are both in contact with the sealing substrate in this case. By using the bank and the insulating film in combination, the distance between the organic light emitting element and the sealing substrate is kept more uniform.

A protective film that covers the organic light emitting element and the bank may be used to protect the organic light emitting element from moisture. In this case, the sealing substrate is in contact with the protective film that is formed on the top of the bank. The protective film may be a laminate of plurality of thin films.

When the seal member is placed on the top of the bank or the top of the insulating film that is formed in the same step as the bank, the distance between the sealing substrate and the top of the bank or insulating film is locally widened at the area where the seal member is provided. This makes the distance between the sealing substrate and the organic light emitting element nonuniform throughout the pixel portion. Therefore, the seal member has to detour around the top of the bank.

If the insulating film that is formed in the same step as the bank conforms with a given pattern, the distance between the sealing substrate and the organic light emitting element can have more improved uniformity. This pattern is described below.

In the pixel portion and the driving circuit portion where wiring lines and electrodes form fine patterns, inequalities of their surfaces due to the thicknesses of the wiring lines and electrodes can be leveled by forming an organic resin film on the wiring lines and the electrodes. The degree of leveling varies depending on the thickness of the organic resin film and the thicknesses of the wiring lines and electrodes. For example, when the organic resin film is formed on the wiring lines and electrodes that cause a level difference of several hundreds of nm with their thicknesses, the remaining level difference on the surface of the organic resin film is approximately half the initial level difference or less.

However, in a terminal portion provided with a plurality of terminals for connecting an FPC (flexible printed circuit) or other portions where wiring lines and electrodes are wide, forming an organic resin film on the wiring lines and the electrodes is not effective in leveling the irregularities caused by the thicknesses of the wiring lines and electrodes. The level difference between the plane of the organic resin film on the wiring lines and electrodes and the plane of the organic resin film in the periphery of the wiring lines and electrodes is almost equal to the thicknesses of the wiring lines and electrodes.

It is true that the degree of leveling varies depending on the thickness of the organic resin film and the thicknesses of the wiring lines and electrodes. However, the thicknesses of the wiring lines and electrodes are relatively easily leveled when wiring lines and electrodes in the pixel portion or driving circuit portion are 50 µm or less in width, or when the pixel portion has finely-patterned pixels and its wiring lines and electrodes are 10 µm or less in width, compared with the terminal portion.

FIG. 11A is a sectional view showing the film thickness distribution after the organic resin film 136 is formed. A source electrode 116, a drain electrode 117, a wiring line 124, and a wiring line 125 are conductive films formed over a substrate 100. The wiring line 124 and the wiring line 125 are terminals for inputting external signals, and are about 100 to 1000 µm in width in order to lower the wiring line resistance. When the organic resin film 136 is formed so as to cover the wiring lines and the electrodes, the area above the wiring lines 124 and 125 alone is not leveled. As a result, the top of the organic resin film 136 on a terminal portion 122 is in a higher plane than the top of the organic resin film 136 on a pixel portion 120 and a driving circuit portion 121. In order to make the distance between the organic light emitting element and the sealing substrate uniform, it is better to remove the organic resin film on the wiring lines 124 and 125 as shown in the sectional view of FIG. 11B. After that part is removed, the remaining organic resin films are denoted by 137 and 138 and there is almost no level difference between their tops.

In short, when wiring lines are wide (100 to 1000 µm), the organic resin film on the wide wiring lines is like a mound to the ground of the organic resin film on the region that has no wide wiring lines. Therefore, the organic resin film on the wide wiring lines is removed to preferably make the level of the top face of the organic resin film uniform throughout the substrate.

FIG. 7 is a top view showing an example of wiring lines of the pixel portion and a description is given about the widths of the wiring lines. A power supply wiring line 420 is taken as an example. A wiring line width 438 of the power supply wiring line 420 is 1 to 10 µm. A wiring line width 438 is the distance from one end of a wiring line to the other end thereof. The wider the wiring line width, the lower the wiring line resistance. A wiring line length is the distance at which a signal is transmitted along a lead-out wiring line. The longer the wirings line length, the higher the wiring line resistance.

The film for forming the bank preferably has a thickness of 1.5 µm or more and 10 µm or less. If the film is thinner than this, the organic light emitting element may be broken when a foreign matter on the sealing substrate is thick in section. In addition, a thinner bank means a small difference in length between a light path for light that is reflected at the interface of the sealing substrate and that at the interface of the organic light emitting element, thereby increasing the expectation of coloring caused by constructive interference of a specific wavelength of visible light. If the bank is thicker than the above range, the coverage of the protective film or the like formed on the bank is poor and it is difficult to cover the bank uniformly.

The structures of the present invention are as follows. A display device of the present invention comprises: an element substrate having an organic light emitting element; a sealing substrate placed so as to oppose the element substrate; and a seal member for bonding the element substrate and the sealing substrate, and is characterized in that: a bank is formed on the element substrate; and the top of the bank and the top of the seal member are in contact with the sealing substrate.

A display device of the present invention comprises: an element substrate having an organic light emitting element; a sealing substrate placed so as to oppose the element substrate; and a seal member for bonding the element substrate and the sealing substrate, and is characterized in that: the element substrate has a bank and an insulating film formed in the same step as the bank; and the top of the bank, the top of the insulating film, and the top of the seal member are in contact with the sealing substrate.

In the above structures, the display device is characterized in that the bottom of the seal member is in contact with one of films that are formed in the same step as a lamination under the bank.

A display device of the present invention comprises: an element substrate having an organic light emitting element; a sealing substrate placed so as to oppose the element substrate; and a seal member for bonding the element substrate and the sealing substrate, and is characterized in that: the element substrate has a bank, an insulating film formed in the same step as the bank, and a protective film for covering at least the top of the bank; and the protective film placed on the top of the bank and the top of the seal member are in contact with the sealing substrate.

A display device of the present invention comprises: an element substrate having an organic light emitting element; a sealing substrate placed so as to oppose the element substrate; and a seal member for bonding the element substrate and the sealing substrate, and is characterized in that: the element substrate has a bank, an insulating film formed in the same step as the bank, and a protective film for covering at least the top of the bank as well as the top of the insulating film; and the protective film placed on the top of the bank and on the top of the insulating film, and the top of the seal member are in contact with the sealing substrate.

In the structures that have a protective film out of the above structures, the display device is characterized in that the protective film is sandwiched between the bottom of the seal member and one of films that are formed in the same step as a lamination under the bank.

In the above structures, the display device is characterized in that when there is a conductive film contacting the bottom of the bank and the bottom of the insulating film, the width of the conductive film is 50 μm or less.

In the structures that have a protective film out of the above structures, the display device is characterized in that the element substrate is provided with: a pixel electrode; the bank placed so as to cover the edges of the pixel electrode; an organic compound layer formed on the pixel electrode in contact with only side faces among the surfaces of the bank; and an opposite electrode formed on the organic compound layer in contact with only side faces among the surfaces of the bank.

In the structures that have a pixel electrode and an opposite electrode out of the above structures, the display device is characterized in that the pixel electrode is formed of a material reflective of light whereas the opposite electrode is formed of a material translucent of light.

In the above structures, the display device is characterized in that the space surrounded by the element substrate, the sealing substrate, and the seal member is vacuum.

In the structures that have a protective film out of the above structures, the display device is characterized in that the protective film comprises of a plurality of films.

In the above structures, the display device is characterized in that: one face of the sealing substrate that opposes the element substrate has spectroscope filters; and the organic compound layer is placed under the spectroscope filters.

A method of manufacturing a display device of the present invention is summarized as follows.

According to the present invention, a method of manufacturing a display device with an organic light emitting element composed of a pixel electrode, an opposite electrode, and an organic compound layer, the organic compound layer being sandwiched between the pixel electrode and the opposite electrode, the organic light emitting element being formed over an element substrate, the element substrate being bonded to a sealing substrate with a seal member, the sealing substrate opposing the element substrate, is characterized by comprising: a first step of forming a bank so as to cover the edges of the pixel electrode; a second step of forming the organic compound layer on the pixel electrode, a third step of forming the opposite electrode on the organic compound layer; a fourth step of placing the seal member in areas corresponding to the periphery of the sealing substrate; and a fifth step of bonding the sealing substrate so that the sealing substrates in contact with the top of the bank and then curing the seal member.

In the above structure, the method of manufacturing the display device is characterized in that: an insulating film is formed at the same time the bank is formed in the first step; and the sealing substrate is bonded in the fifth step to be brought into contact with the top of the bank and the top of the insulating film.

In the above structures, the method of manufacturing the display device is characterized in that: a step of forming a protective film is interposed between the third step and the fourth step, the protective film over at least the top of the bank and the top of the opposite electrode; and at least the protective film on the top of the bank comes into contact with the sealing substrate in the fifth step.

In the structures that include a bank and an insulating film out of the above structures, the method of manufacturing the display device is characterized in that the bank and the insulating film are provided in a region where a conductive film is 50 μm or less in width.

With the display device and its manufacture method structured as above, the present invention can prevent degradation of an organic light emitting element of the display device and improve the yield.

With the display device and its manufacture method structured as above, the present invention can provide display of high luminance and definition, prevent degradation of an organic light emitting element, improve the yield, and raise the uniformity in luminance to obtain excellent display performance when light emitted from the organic light emitting element is taken out from the sealing substrate side.

The present invention having the above structures will be described in detail through the following embodiment modes and embodiments. The embodiment modes and embodiments can be combined suitably.

BRIEF DESCRIPTION OF THE DRAWINGS

FIGS. 9A to 9D are perspective views illustrating examples of electronic equipment of Embodiment 2 of the present invention;

FIGS. 10A to 10C are perspective views illustrating examples of electronic equipment of Embodiment 2 of the present invention;

DETAILED DESCRIPTION OF THE PREFERRED EMBODIMENTS

Embodiment Mode 1

This embodiment mode shows a structure for controlling the distance between substrates using a bank in a pixel portion and an insulating film formed in the same step as the bank. The insulating film is placed only on a driving circuit portion.

Figure 1:
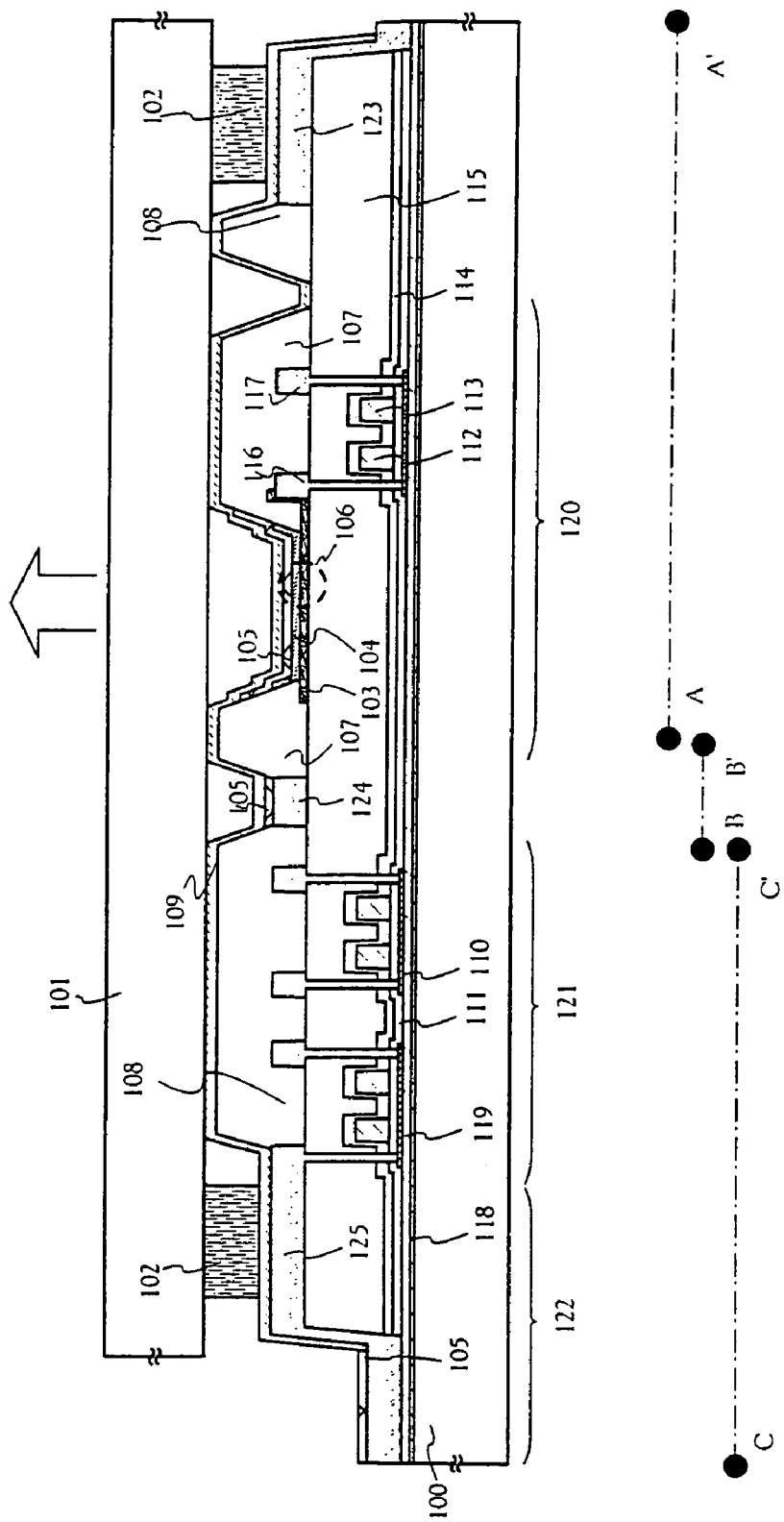
FIG. 1 is a sectional view of a display device using an organic light emitting element in accordance with Embodiment Mode 1 of the present invention.

Shown in FIG. 1 is a sectional view of an active matrix display device using an organic light emitting element. The structural components of the display device in FIG. 1 will be described one by one.

A substrate 100 is a substrate formed of glass such as barium borosilicate glass and alumino borosilicate glass, typical examples of which are Corning #7059 glass and #1737 glass (products of Corning Incorporated). A quartz substrate, a silicon substrate, or a stainless steel substrate may be used instead if an insulating film is formed on its surface. Alternatively, the substrate 100 may be a plastic substrate having a heat resistance that can withstand the treatment temperature of this embodiment mode.

An insulating film such as a silicon oxide film, a silicon nitride film, and a silicon oxynitride film is used as a base film. The base film in this embodiment mode has a two-layer structure but it may be a single layer or a laminate of three or more layers using the insulating films listed above. In this embodiment mode, a base film 118 is a silicon oxynitride film with a thickness of 10 to 100 nm. A base insulating film 119 is a silicon oxide film with a thickness of 20 to 200 nm.

A silicon film of 10 to 150 nm in thickness is formed as a semiconductor film 110. A nitride film of 20 to 300 nm in thickness is formed as a gate insulating film 111. Gate electrodes 112 and 113 are obtained by layering a tungsten film with a thickness of 370 to 400 nm on a tantalum nitride film with a thickness of 30 to 60 nm (first conductive film). A silicon oxynitride film having a thickness of 50 to 150 nm is formed as a first interlayer insulating film 114. A second interlayer insulating film 115 is an acrylic resin film with a thickness of 1 to 3 µm.

The first interlayer insulating film 114 may be a silicon nitride film instead of a silicon oxynitride film. A silicon nitride film and a silicon oxynitride film are highly effective barriers to impurities and can prevent Li, Mg, or other alkaline components eluted from a cathode of an organic light emitting element which is described later from degrading electric characteristics of TFTs.

A drain electrode 117 and a source electrode 116 have a laminate structure consisting of a 50 to 800 nm thick titanium film, a 350 to 400 nm thick aluminum alloy film and a 100 to 1600 nm thick titanium film. The aluminum alloy film is formed of a material mainly containing aluminum and doped with silicon as an impurity element. Although the drain electrode and source electrode of this embodiment mode have a laminate structure consisting of three layers of conductive films, a single layer structure or a two-layer structure may be employed instead. A conductive film 123 and wiring lines 124 and 125 are formed from the same layer as the drain electrode and the source electrode. TFTs are thus formed in a pixel portion and a driving circuit portion.

A pixel electrode 103 is formed by evaporation from a material containing magnesium (Mg), lithium (Li), or calcium (Ca) that is small in work function. Preferably, an electrode formed of MgAg (a material obtained by mixing Mg and Ag at a ratio of Mg:Ag=10:1) is used. Examples of other usable electrodes include an MgAgAl electrode, an LiAl electrode, and an LiFAl electrode. The pixel electrode in this embodiment mode is a cathode formed of MgAg, LiF, or the like. The thickness of the pixel electrode is set to 100 to 200 nm. The pixel electrode partially overlaps the source electrode 116.

Banks 107 are formed so as to cover the wiring lines of the TFTs from an organic resin film such as an acrylic resin film or a polyimide resin film. The organic resin film has a thickness of 1.5 to 10 µm. An insulating film 108 is formed in the same step as the banks. The insulating film 108 covers the TFTs to protect the TFTs of the driving circuit from impact given from the outside.

An organic compound layer 104 is formed by evaporation along the gentle slope of the banks. The banks serve as partition walls for separating red light emitting layers, blue light emitting layers, and green light emitting layers of pixels by colors in order to prevent mixing of materials during the light emitting layers are formed by evaporation. The banks also cover projections caused by the electrodes and wiring lines, thereby preventing wiring breakage of the organic compound layer and resultantly a short circuit between the pixel electrode and an opposite electrode.

The organic compound layer comprises an electron transporting layer, a light emitting layer, a hole transporting layer, and a hole injection layer, which are layered in this order. Alternatively, the organic compound layer may have an electron transporting layer, a light emitting layer, and a hole transporting layer, which are layered in this order, or an electron injection layer, an electron transporting layer, a light emitting layer, a hole transporting layer, and a hole injection layer, which are layered in this order. The present invention can employ any known structure for organic compound layer.

Specific materials used in light emitting layers of organic compound layers are as follows. A red light emitting layer is formed from cyanopolyphenylene, a green light emitting layer is formed from polyphenylene vinylene, and a blue light emitting layer is formed from polyphenylene vinylene or polyalkyl phenylene. Each of the light emitting layers has a thickness of 30 to 150 nm.

The materials given in the above are merely examples of what can be used in the light emitting layers and the present invention is not limited thereto. Materials for forming a light emitting layer, a hole transporting layer, a hole injection layer, an electron transporting layer, and an electron injection layer can be chosen from any possible combinations.

An opposite electrode 105 is an ITO (indium tin oxide) film formed by sputtering. The thickness of the opposite electrode is set to 100 to 200 nm. The opposite electrode is in contact with side faces of the banks adjacent to each other. Though not shown in the drawing, short circuit of the opposite electrode takes place outside the display portion to make the electrode a common electrode.

A protective film 109 is preferably a silicon nitride film, a silicon oxynitride film, or a DLC (diamond like carbon) film. Since emitted light is taken out through the protective film, the material and thickness of the protective film have to be chosen so that a high transmittance is obtained in visible light range. The energy band of an insulator consists of a valence band, a forbidden band, and a conduction band. Absorption of light is caused by shift of electrons from the valence band to the conduction band. Therefore, the correlation with the visible light transmittance can be found by obtaining the absorption edge of light from the energy width of the forbidden band, i.e., a band gap. The band gap of silicon nitride film is 5 eV. A silicon oxynitride film has a band gap of 5 eV to 8 eV depending on the film property. A DLC film is 3 eV in band gap. Calculating from the velocity of light and Planck's constant, the absorption edge of light obtained is 248 nm for a silicon nitride film, 155 to 248 nm for a silicon oxynitride film, and 413 nm for a DLC film. In short, there is no absorption of light in visible light range for a silicon nitride film and a silicon oxynitride film. A DLC film absorbs violet light in visible light range and takes a brownish shade. In this embodiment mode, a DLC film is used as the protective film to protect the organic light emitting element from moisture. The DLC film has to be thin and set to 100 to 200 nm so that the film does not absorb short wavelength visible light much.

The substrate structured as above is called an element substrate in this embodiment mode. The element substrate shown in the above has a structure in which the organic compound film and the opposite electrode are layered on the pixel electrode. Between the pixel electrode and the organic compound layer, or between the organic compound layer and the opposite electrode, a thin film formed from an insulating material to a thickness of several nm to several tens of nm may be provided in order to prevent short circuit between the electrodes (the pixel electrode and the opposite electrode). The thin film formed on the pixel electrode from an insulating material doubles as a protective film for protecting the cathode from moisture and oxygen since the pixel electrode is a cathode formed of AlLi or MgAg.

A sealing substrate 101 is a substrate formed of glass such as barium borosilicate glass and alumino borosilicate glass, typical example of which are Corning #7059 glass and #1737 glass (products of Corning Incorporated). A quartz substrate, or a plastic substrate having a heat resistance that can withstand the treatment temperature of this embodiment mode, may be used instead.

If a glass substrate is used for the sealing substrate, it is preferable to use a glass substrate also for the element substrate. When there is a rapid change in temperature of the surroundings in which the display panel is used, the element substrate and sealing substrate that have the same thermal expansion coefficient can be saved from being broken by thermal shock because the substrates experience the same degree of thermal change. A substrate with reduced thickness has a lower mechanical strength and is easily broken by thermal shock. Therefore it is particularly effective to match thermal expansion coefficients of the substrates in preventing breakage of the substrates.

A seal member 102 is an epoxy-based material. UV-curable resins and thermosetting resins both can be used as the seal member. It is preferable to choose a seal member material that can be cured at a temperature not higher than the heat resistant temperature of the organic light emitting element. LIXSON BOND LX-0001 sold by Chisso Corporation, may be used as the seal member. The LX-0001 is a two-pack type epoxy resin. After the LX-0001 is applied to the perimeter of the sealing substrate, the sealing substrate and the element substrate are bonded and heated at 100° C. while applying a pressure vertical to the substrate planes to the top and bottom of the pair of substrates. The heating is continued for 2 hours to cure the resin. The thickness of the seal member after the curing can be varied between 0.2 μm and 10 μm by adjusting the pressure and the amount of the resin applied. The seal member has an exhaust hole by opening a gap in a part of the pattern.

The display panel composed of the element substrate and sealing substrate that are bonded by the seal member is placed in a vacuum container and is exhausted through the exhaust hole of the panel until the vacuum is reached. In this state, the exhaust hole is sealed while keeping the interior of the panel vacuum. The interior of the panel thus remains vacuum.

A terminal portion 122 is provided with external input terminals. The external input terminals placed at an end of the panel are connected to an FPC (flexible printed circuit) through an anisotropic conductive film. Image data signals, various kinds of timing signals, and power are inputted to the external input terminals from external circuits. Image data signals and timing signals inputted through the external input terminals, such as start pulses and clock pulses, are outputted to driving circuits.

The anisotropic conductive film is a resin film in which micro particles coated with a metal such as nickel or carbon are dispersed, so that a current flows between the external input terminals and the FPC but not between the external input terminals.

The conductive film 123 is subsidiarily used to make the thickness of the laminate below the seal member 102 the same in all regions where the seal member is placed and keep the distance between the element substrate and the sealing substrate uniform. The conductive film 123 covers the top face and side faces of an organic resin film that serves as a second interlayer insulating film, except the area for forming the external input terminals so that the film is insulated from the external input terminals. The area in which the external input terminals are formed is described later. The conductive film 123 is provided to make the level of the top of the seal member 102 uniform throughout the substrate plane. In other words, the conductive film 123 is provided to cancel the level difference between the top of the seal member in the region where the external input terminals are placed and the top of the seal member in the region that has no external input terminals.

Figure 5:
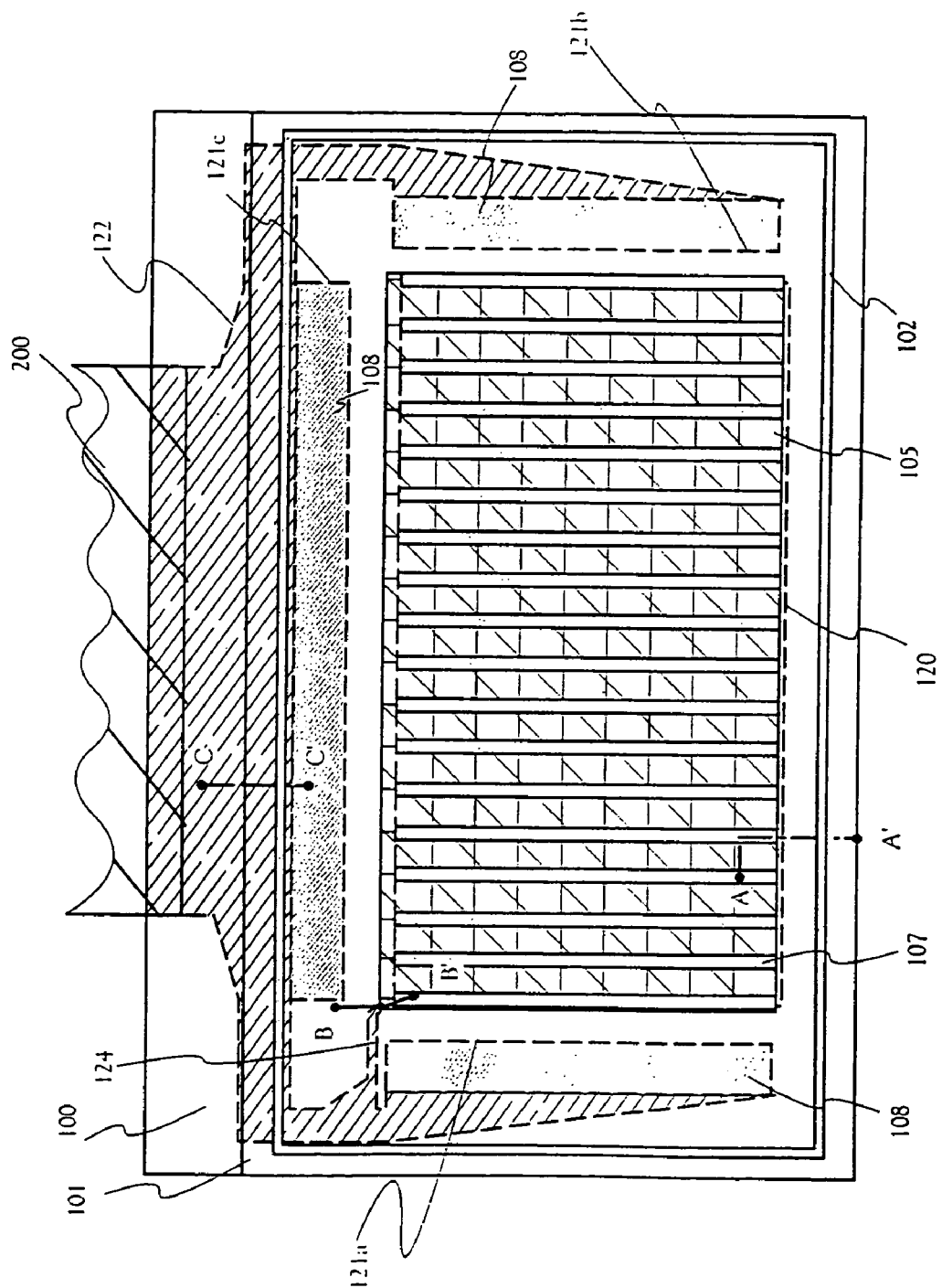
FIG. 5 is a top view of the exterior of the display device using an organic light emitting element in accordance with Embodiment Mode 1 of the present invention.

The top view in FIG. 5 shows the exterior of this display device. FIG. 5 is cut along the dot-dash lines A-A', B-B', and C-C' to obtain the sectional view of FIG. 1. The sectional view taken along the dot-dash line A-A' shows the peripheries of a pixel portion 120 and the panel, the sectional view taken along the dot-dash line B-B' shows a connection structure between the wiring line 124 of the external input terminals and the opposite electrode 105, and the sectional view taken along the dot-dash line C-C' shows a connection structure between the TFTs of the driving circuit portion 121 and the wiring line 125 of the external input terminals.

In which way light emitted from an organic light emitting element travels varies depending on the structure of the light emitting element. Here, a light-reflective cathode serves as a pixel electrode whereas a light-transmissive anode serves as the opposite electrode and the sealing substrate is transmissive of light, so that light emitted from the organic light emitting element travels toward the sealing substrate side.

The pixel portion 120, driving circuit portions 121a to 121c, and the terminal portion 122 are regions surrounded by the dotted lines in the drawing. In the terminal portion, the wiring lines 124 and 125 that constitute the external input terminals are formed and an FPC 200 is connected to the external input terminals through the anisotropic conductive film.

The driving circuit portion 121 include a first scanning line side driving circuit portion 121a, a second scanning line side driving circuit portion 121b, and a signal side driving circuit portion 121c. The scanning line side driving circuit portions and the signal side driving circuit portion have different circuit structures, of which descriptions are omitted. Each of the driving circuit portions is structured with a CMOS circuit, which is composed of an n-channel TFT and a p-channel TFT, as a base circuit. These TFTs are used to build a shift register, a latch circuit, a buffer circuit, and the like. The insulating film 108 is formed so as to cover the TFTs of the driving circuits. This insulating film is formed in the same step as the banks.

The banks 107 form a stripe pattern in the column direction in the pixel portion. The opposite electrode 105 is a common electrode and forms a stripe pattern along the side faces of the banks 107 to be short-circuited outside the display region where no bank is formed.

The sealed space surrounded by the substrate 100, the substrate 101, and the seal member 102 is kept vacuum. This makes the moisture content and oxygen concentration in the sealed space low and prevents degradation of the organic light emitting element, such as dark spot.

When the sealed space is kept vacuum, high pressure is applied to the surfaces of the substrates (element substrate and sealing substrate) from the outside air because of the difference between atmospheric pressure and vacuum pressure. However, the banks densely formed in the pixel portion hold the distance between the organic light emitting element and the sealing substrate and does not allow the pressure applied to the substrates to bring the sealing substrate into contact with the organic light emitting element and damage the organic light emitting element.

The insulating film 108 placed on the TFTs of the driving circuit portions is an elastic organic resin film that covers a wide area. Therefore the insulating film 108 works as a buffer for preventing damage to the TFTs from externally-applied mechanical impact by dispersing the pressure. When combined with the banks, the insulating film 108 also acts as a gap controlling member for making the distance between the organic light emitting element and the sealing substrate uniform and preventing interference fringe in the pixel portion.

Embodiment Mode 2

This embodiment mode describes a display device in which a sealing substrate has a color filter and the color filter is combined with a white light emitting diode to display a color image.

Figure 2:
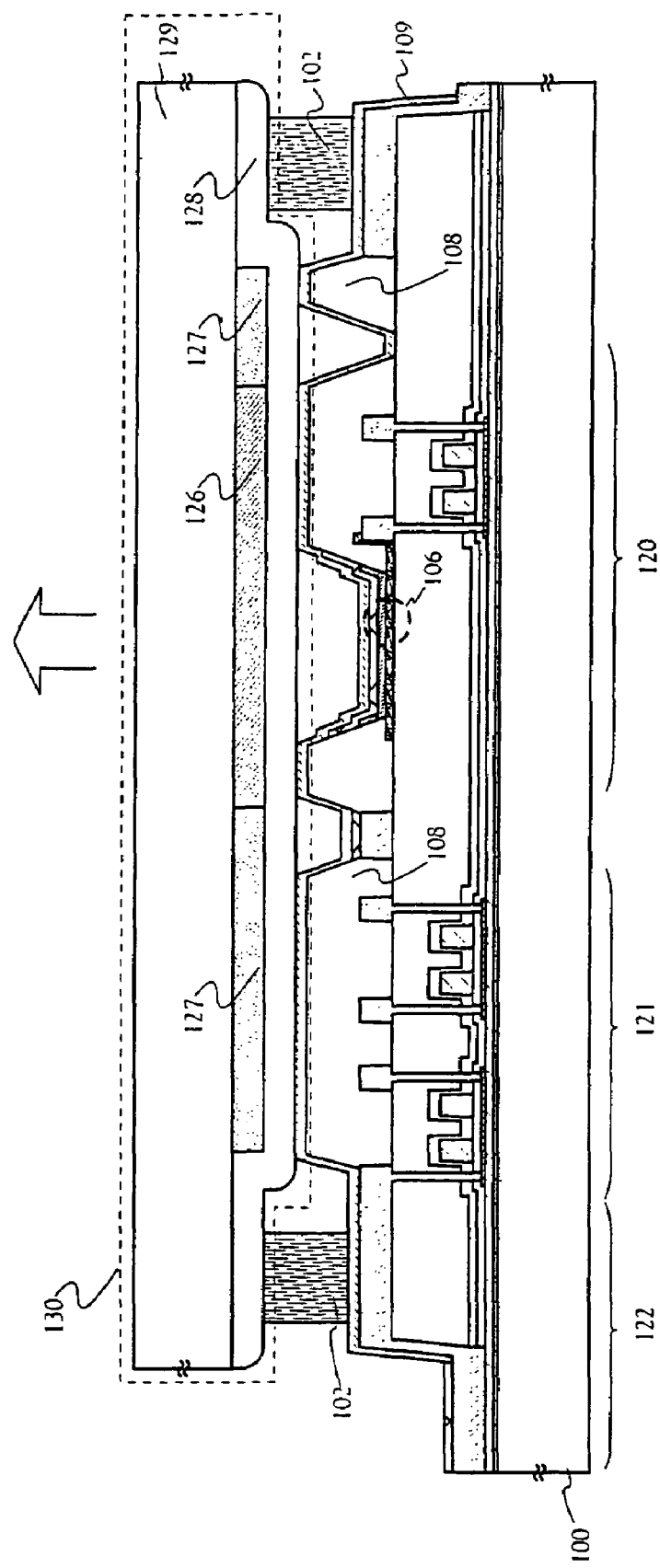
FIG. 2 is a sectional view of a display device using an organic light emitting element in accordance with Embodiment Mode 2 of the present invention.

FIG. 2 is a sectional view of a display device that uses an organic light emitting element. Components of FIG. 2 that have identical functions as those of FIG. 1 are denoted by the same reference symbols. The description is given focusing on differences from FIG. 1. The organic light emitting element used here is a white light emitting diode. To make the diode emit white light, a light emitting layer of its organic compound film is formed of a ZnBTZ complex, or a laminate consisting of aromatic diamine (TPD), a 1,2,4-triazole derivative (p-EtTAZ), and Alq (Alq is partially doped with Nile red that is a red light emitting pigment).

An element substrate having an organic light emitting element 106 and a sealing substrate 130 are bonded using a seal member 107. The sealing substrate 130 is composed of a light-transmissive substrate 129, a color filter on the substrate 129, and a planarization film 128 that covers the color filter. The color filter comprises a first spectroscope filter, a second spectroscope filter, and a third spectroscope filter. For instance, the first spectroscope filter selectively transmits red light, the second spectroscope filter selectively transmits green light, and the third spectroscope filter selectively transmits blue light. The planarization film 128 levels the level difference caused by overlap of adjacent spectroscope filters or a gap between adjacent spectroscope filters.

Each pixel has one of the spectroscope filters. For instance, a first spectroscope filter 126 is placed above the organic light emitting element. The color filter, a second spectroscope filter 127, for example, is placed in a region inside the seal member and outside the pixel portion. This makes the contact area between the insulating film 108 and the sealing substrate 130 large, thereby enhancing the uniformity in distance between the organic light emitting element and the sealing substrate.

When the element substrate and the sealing substrate are sealed in argon, helium, or other inert gas atmosphere, or in nitrogen atmosphere, the organic light emitting element is protected from moisture and oxygen, so that oxidization reaction of the cathode as well as peeling of the organic compound layer off the cathode can be avoided. The inert gas used has to be dried well in advance.

The distance between the organic light emitting element 106 and the color filter, the first spectroscope filter 126, for example, is determined by the thickness of the banks. The banks are 1.5 to 10 μm in thickness. Therefore the organic light emitting element is no more than 10 μm from the color filter and can be kept close to the color filter. Since the color filter and the light emitter are close to each other, color shift accompanying a change in user's viewing angle is avoided and clear display is obtained.

Embodiment Mode 3

This embodiment mode shows an example in which a drying agent is dispersed in a seal member.

Figure 3:
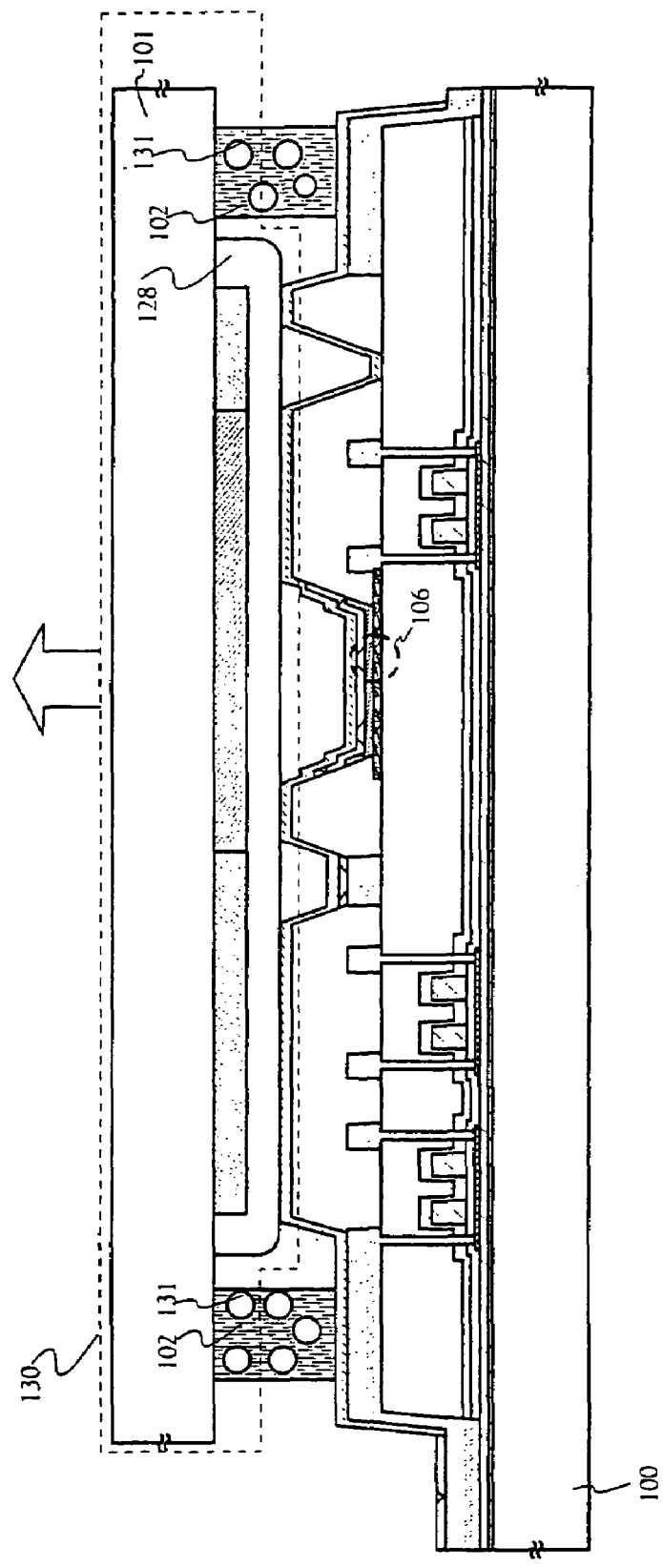
FIG. 3 is a sectional view of a display device using an organic light emitting element in accordance with Embodiment Mode 3 of the present invention.

The description of this embodiment mode is given with reference to the sectional view of FIG. 3. Components of FIG. 3 that have identical functions as those of FIG. 2 are denoted by the same reference symbols. Differences between FIG. 3 and FIG. 2 alone are described. The seal member 102 has a drying agent 131 inside. The drying agent used has to be finely pulverized one with its particle size being 1.0 μm or less in diameter, preferably, 0.2 μm or less. Calcium oxide, barium oxide, or the like can be used as the drying agent. A syringe is filled with the seal member with the drying agent mixed therein. Gas pressure is applied at a given value to the top of the syringe by a known dispenser method. The seal member and the drying agent are thus squeezed out of a thin nozzle positioned at the distal end of the syringe and are placed on the perimeter of the sealing substrate 130.

Since the seal member with the drying agent mixed in is hygroscopic and moisture-proof, the planarization film 128 on the color filter is removed from the area where the seal member is placed. This raises the area ratio of the seal member on the side faces of the display device, so that the drying agent mixed in the seal member catches moisture that is about to enter the sealed space from the outside air.

The sealed space is filled with an insulating material that has an index of refraction similar to the index of refraction of the sealing substrate, for example, an insulating oil. When the difference in index of refraction between the sealing substrate and the insulating oil or other insulating material is small, the surface reflection is reduced to improve the efficiency of use of light emitted from the organic light emitting element. The long term reliability of the organic light emitting element is improved when oxygen and moisture are prevented from mixing in by removing air bubbles from the insulating oil and dehydrating the oil well.

A known technique can be used to fill the sealed space with the insulating oil. For instance, the element substrate and sealing substrate bonded by the seal member to constitute a panel is placed in a vacuum container along with a container filled with the insulating oil. Then the air in the space between the element substrate and the sealing substrate is exhausted from the exhaust hole in the panel to achieve vacuum. In this state, the exhaust hole of the panel is immersed in the insulating oil and the pressure in the vacuum container is returned to the atmospheric pressure. As a result, atmospheric pressure is applied to the surface of the insulating oil, injecting the insulating oil into the vacuum space between the element substrate and the sealing substrate. The exhaust hole is then sealed in this state.

The drying agent captures steam from the outside before it enters the sealed space. The moistureproofness and hygroscopicity are thus improved to prolong the lifetime of the organic light emitting element.

Embodiment Mode 4

Figure 4:
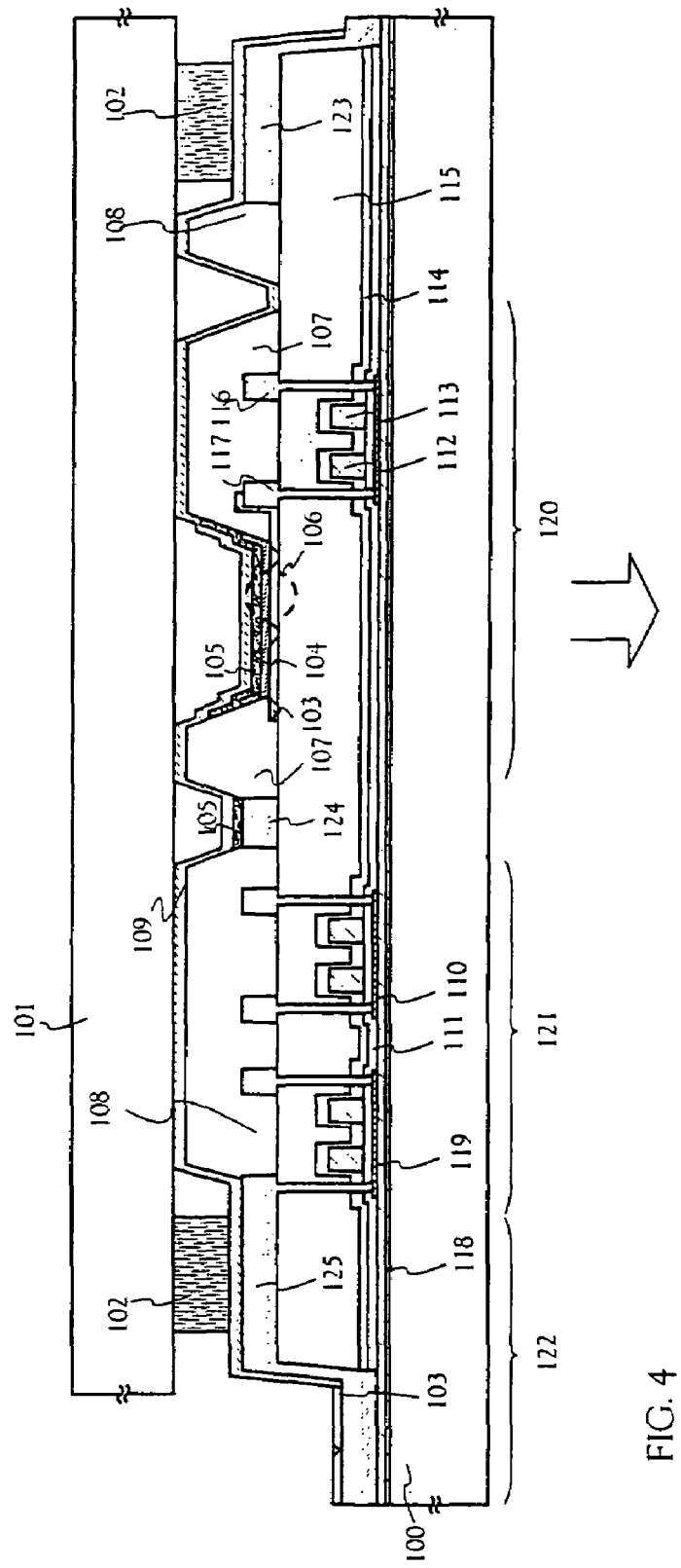
FIG. 4 is a sectional view of a display device using an organic light emitting element in accordance with Embodiment Mode 4 of the present invention.

The present invention is also applicable to a display device in which light emitted from an organic light emitting element is taken out from the element substrate side. FIG. 4 shows an active matrix display device using an organic light emitting element and structured so as to take out light emitted from the organic light emitting element from the element substrate side. The emitted light travels downward in the sectional view of FIG. 4. Components in FIG. 4 that have functions similar to those in FIG. 1 are denoted by the same reference symbols. Similarities and differences between Embodiment Mode 1 and this embodiment mode will be described below.

Thicknesses and materials of base film 118, base film 119, semiconductor film 110, gate insulating film 111, gate electrode 112, gate electrode 113, first interlayer insulating film 114, and second interlayer insulating film 115 in this embodiment mode are the same as those in Embodiment Mode 1.

Contact holes piercing through the second interlayer insulating film 115 are formed to reach the semiconductor film 110. A source electrode 116 and a drain electrode 117 are formed so that the electrodes are in contact with the inner walls of the contact holes and with the surface of the second interlayer insulating film. Wiring lines 124 and 125 and a conductive film 123 are formed at the same time the source electrode and the drain electrode are formed.

A pixel electrode 103 is formed next so as to overlap the edges of the drain electrode 117. The pixel electrode in this embodiment mode is a transparent electrode formed of an ITO film or a transparent conductive film that is obtained by mixing 2 to 20% of zinc oxide (ZnO) with indium oxide. The transparent electrode is used as a hole injection electrode, namely, anode.

Next, a polyimide resin film is formed to a thickness of 3.0 µm as an insulating film 108 for covering banks 107 and TFTs of a driving circuit portion 121. An organic compound layer 104 and an opposite electrode 105 are then formed by evaporation. It is preferable to perform heat treatment on the pixel electrode 103 prior to formation of the organic compound layer 104 in order to remove moisture from the pixel electrode completely. In this embodiment mode, the opposite electrode 105 of the organic light emitting element 106 serves as a cathode and an AlLi electrode is employed. However, other known materials may be used for the opposite electrode. The organic compound layer 104 is a laminate having, in addition to a light emitting layer, a combination of different layers selected from a hole injection layer, a hole transporting layer, an electron transporting layer, and an electron injection layer.

The organic light emitting element is formed on a substrate 100 as described above. In this embodiment mode, the lower electrode is an anode transmissive of light and therefore light generated in the organic compound layer is emitted downward (toward the substrate 100).

A protective film 109 may be provided to protect the organic compound layer 104 and the opposite electrode (cathode) 105 from moisture and oxygen. The protective film 109 in this embodiment mode is a silicon nitride film with a thickness of 300 nm. The cathode and the protective film 109 may be formed in succession without exposing the substrate to the air.

Next, a seal member 102 is placed on the periphery of the sealing substrate to bond the sealing substrate and the element substrate. The sealing substrate is a substrate formed of glass such as barium borosilicate glass and alumino borosilicate glass, typical examples of which are Corning #7059 glass and #1737 glass (products of Corning Incorporated). A quartz substrate, a silicon substrate, a metal substrate, or a stainless steel substrate may be used instead if an insulating film is formed on its surface. Alternatively, the sealing substrate may be a plastic substrate having a heat resistance that can withstand the treatment temperature of this embodiment mode.

According to this embodiment mode, the element substrate and the sealing substrate can be placed close to each other and the amount of moisture entering the display device from its sides can therefore be reduced. Despite the short distance between the element substrate and the sealing substrate, wiring breakage of the organic light emitting element due to dust or other foreign matters on the sealing substrate can be avoided to prevent dot defect.

Embodiment 1

Figure 6:
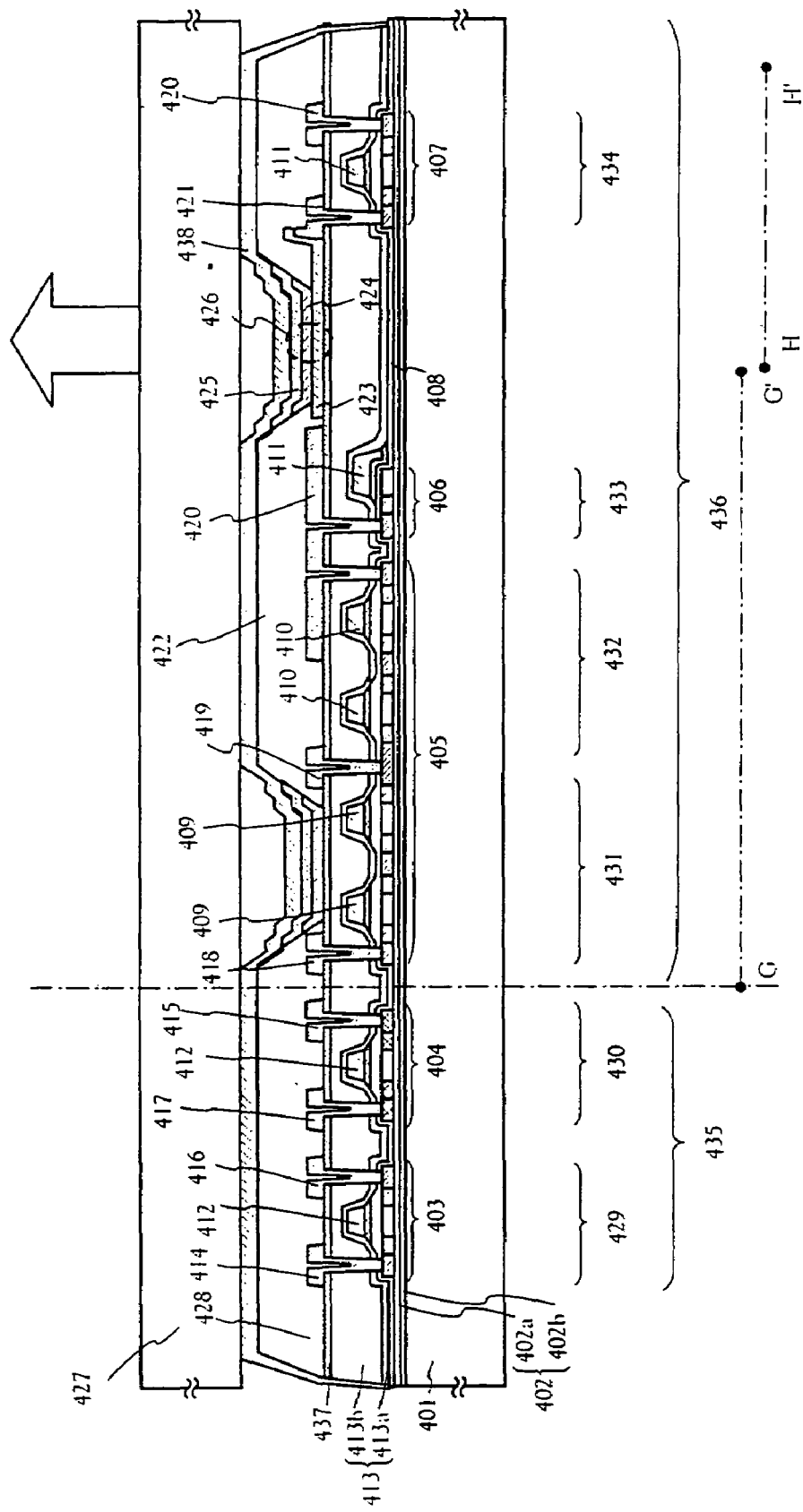
FIG. 6 is a sectional view of an active matrix substrate of Embodiment 1 of the present invention.

The present invention can be applied to every display device that uses an organic light emitting element. FIG. 6 shows an example thereof in the form of an active matrix display device composed of TFTs. TFTs are sometimes classified into amorphous silicon TFTs and polysilicon TFTs by the material of semiconductor film used to form a channel formation region of the TFT. Both types of TFTs can be used as the TFTs of this embodiment if the field effect mobility of their channel formation regions are sufficiently high.

A substrate 401 is a substrate formed of glass such as barium borosilicate glass and alumino borosilicate glass, typical examples of which are Corning #7059 glass and #1737 glass (products of Corning Incorporated).

Next, a base film 402 is formed using an insulating film such as a silicon oxide film, a silicon nitride film, and a silicon oxynitride film. For example, a silicon oxynitride film 402a is formed by plasma CVD from $SiH_4$, $NH_3$, and $N_2O$ to a thickness of 10 to 200 nm (preferably, 50 to 100 nm), and a silicon oxynitride film 402b is formed by plasma CVD from $SiH_4$ and $N_2O$ to a thickness of 50 to 200 nm (preferably, 100 to 150 nm) to obtain a laminate. The base film 402 in this embodiment has a two-layer structure but a single layer or three or more layers of insulating films listed above may be used as the base film.

Formed next are island-like semiconductor layers 403 to 407, a gate insulating film 408, and gate electrodes 409 to 412. The island-like semiconductor layers 403 to 407 are each 10 to 150 nm in thickness. The gate insulating film is 50 to 200 nm in thickness. The gate electrodes are each 50 to 800 nm in thickness.

An interlayer insulating film 413 is formed next. For instance, a silicon oxynitride film is formed by plasma CVD from $SiH_4$, $NH_3$, and $N_2O$ to a thickness of 10 to 200 nm (preferably, 50 to 100 nm) as a first interlayer insulating film 413a. The first interlayer insulating film may instead be a silicon oxide film or a silicon nitride film. Then an organic resin film is formed to a thickness of 0.5 to 10 µm (preferably 1 to 3 µm) as a second interlayer insulating film 413b. The second interlayer insulating film 413b is preferably an acrylic resin film, a polyimide resin film, or the like. Desirably, the second interlayer insulating film 413b is thick enough to level surface irregularities caused by the island-like semiconductor layers 403 to 407 and the gate electrodes 409 to 412.

Another silicon oxynitride film is formed by plasma CVD from $SiH_4$, $NH_3$, and $N_2O$ to a thickness of 10 to 200 nm (preferably, 50 to 100 nm) as a first protective film 437. The first protective film 437 prevents Li, Mg, or other alkaline components eluted from a cathode of an organic light emitting element which is described later from degrading electric characteristics of the TFTs. The first protective film 437 in this embodiment is a silicon oxynitride film but a silicon oxide film may be used instead of the silicon oxynitride film.

The next step is patterning for forming contact holes that reach the surfaces of the island-like semiconductor layers 403 to 407.

In a driving circuit portion 435, source wiring lines 414 and 415 are formed to be connected to source regions of the island-like semiconductor layers 403 and 404 and drain wiring lines 416 and 417 are formed to be connected to drain regions of 403 and 404. These wiring lines are obtained by patterning a laminate of a Ti film with a thickness of 50 nm and an alloy film (film of alloy of Al and Ti) with a thickness of 500 nm.

A data wiring line 418, a drain side wiring line 419, a power supply wiring line 420, and a drain side electrode 421 are formed in a pixel portion 436. The data wiring line 418 is connected to the source of a switching TFT 431 and a drain side wiring line 419 is connected to the drain of the TFT 431. The drain side wiring line 419 is connected to the gate electrode 411 of a current controlling TFT 434. The power supply wiring line 420 is connected to the source of the current controlling TFT 434 and a drain side electrode 421 is connected to the drain of the TFT 434. The drain side electrode 421 is connected to a pixel electrode 423.

In this way, the driving circuit portion 435 which has an n-channel TFT 429 and a p-channel TFT 430, and the pixel portion 436 which has the switching TFT 431, a reset TFT 432, a capacitor storage 433, and the current controlling TFT 434 are formed on the same substrate.

A pixel electrode 423 of an organic light emitting element 426 is formed next. The pixel electrode 423 is a cathode formed of a reflective material such as MgAg or LiF. The thickness of the cathode is set to 100 to 200 nm. Then banks 422 are formed in the pixel portion 436 using an acrylic resin film with a thickness of 1.5 to 10 µm. At the same time as the banks are formed, an insulating film 428 is formed in the driving circuit portion 435.

An organic compound layer 424 of the organic light emitting element is formed next. The organic light emitting layer may be a single layer or a laminate. An organic compound layer having a laminate structure is superior in light emission efficiency. Generally, a hole injection layer, a hole transporting layer, a light emitting layer, and an electron transporting layer are formed on an anode in this order. The organic compound layer may have other laminate structures such as one consisting of a hole transporting layer, a light emitting layer, and an electron transporting layer, or one consisting of a hole injection layer, a hole transporting layer, a light emitting layer, an electron transporting layer, and an electron injection layer. The present invention can have any known structure for organic compound layer.

In this embodiment, color display is obtained using three types of light emitting layers that are formed by evaporation for respectively emitting light of R, G, and B. Specifically, cyanopolyphenylene is used for a red light emitting layer, polyphenylene vinylene is used for a green light emitting layer, and polyphenylene vinylene or polyalkyl phenylene is used for a blue light emitting layer. Each light emitting layer has a thickness of 30 to 150 nm. The materials given in the above are merely an example of organic compounds that can be used for the light emitting layers, and other materials may be employed.

The organic compound layer of this embodiment is a laminate of a light emitting layer and a hole injection layer that is formed of PEDOT (polythiophene) or PAni (polyaniline).

Next, an opposite electrode 425 is formed from ITO (indium tin oxide). ITO has a high work function of 4.5 to 5.0 eV and is capable of injecting holes in the light emitting layer efficiently. The ITO electrode makes an anode. Thus completed is an organic light emitting element composed of a cathode, which is formed from MgAg, LiF, or the like, an organic compound layer, which is a laminate of a light emitting layer and a hole transporting layer, and an anode, which is formed of ITO. If the anode is a transparent electrode, the organic light emitting element emits light in the direction indicated by the arrow in FIG. 6.

A DLC film is formed next as a second protective film 438 in order to prevent steam and oxygen from entering the device through the scaling portion and to prevent resultant degradation of the organic light emitting element. When the DLC film is formed, a part of a terminal portion where an FPC is to be placed is covered with a mask in advance.

Figure 7:
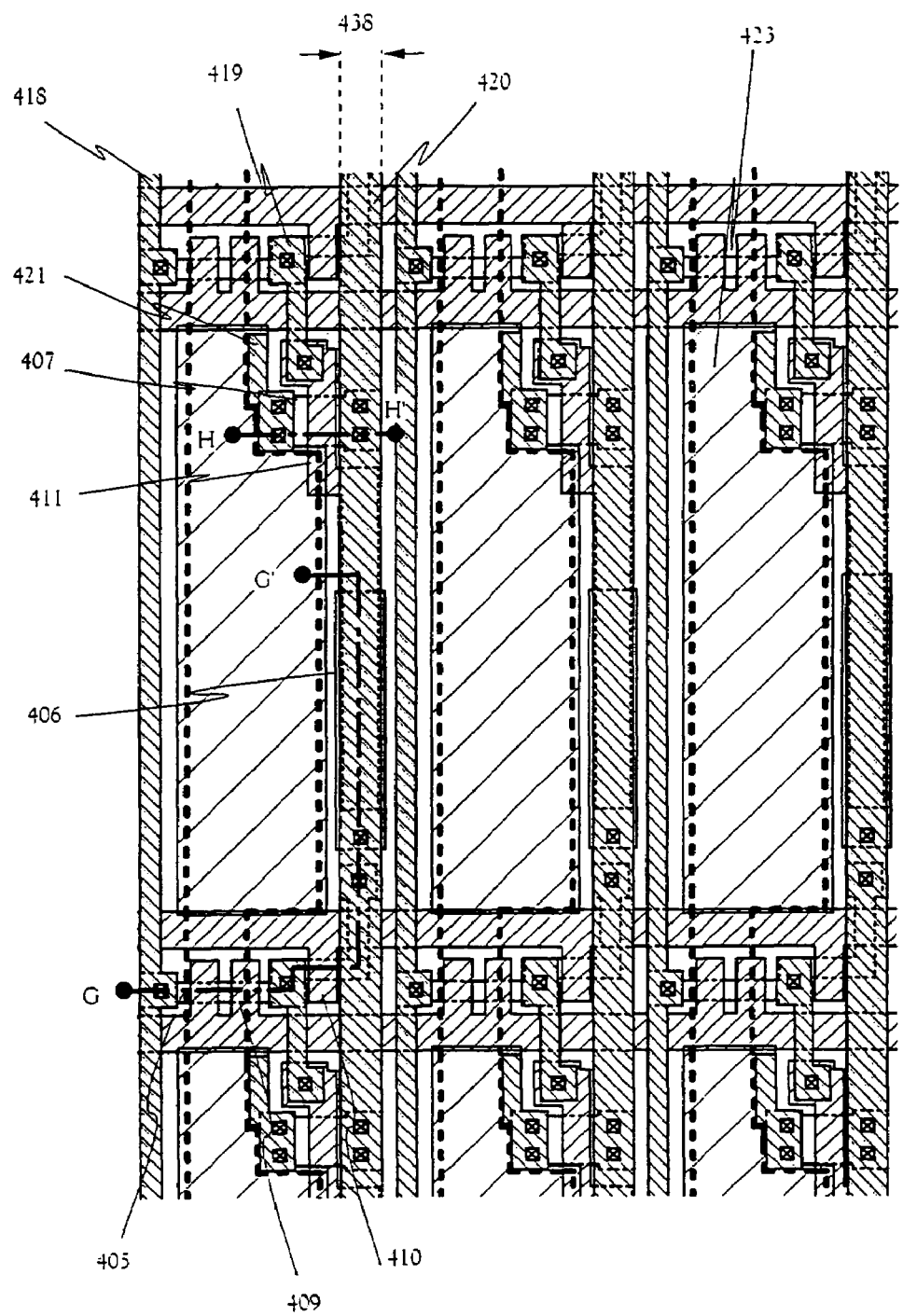
FIG. 7 is a top view of a pixel portion of Embodiment 1 of the present invention.

A top view of the pixel portion that is shown in section in FIG. 6 can be found in FIG. 7. Components common to FIGS. 6 and 7 are denoted by the same reference symbols. The sectional views taken along the dot-dash lines G-G' and H-H' of FIG. 7 are shown in FIG. 6. Banks are placed outside the regions surrounded by the dotted lines in FIG. 7. Formed inside the regions surrounded by the dotted lines are pixels having anodes and red light emitting layers, pixels having anodes and green light emitting layers, and pixels having anodes and blue light emitting layers.

Figure 8:
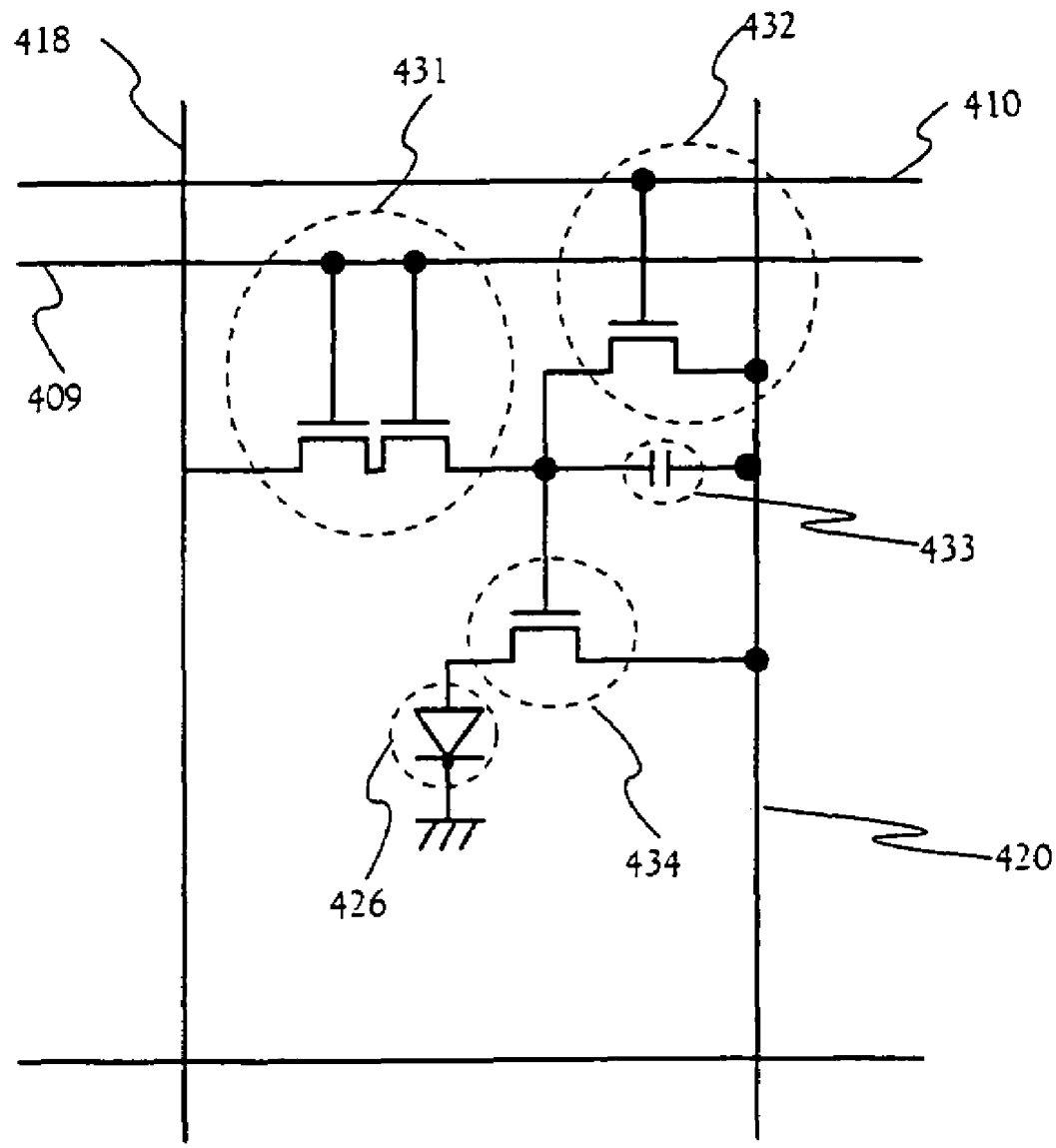
FIG. 8 is a diagram showing an equivalent circuit of the pixel portion of Embodiment 1 of the present invention.
Figure 11A:
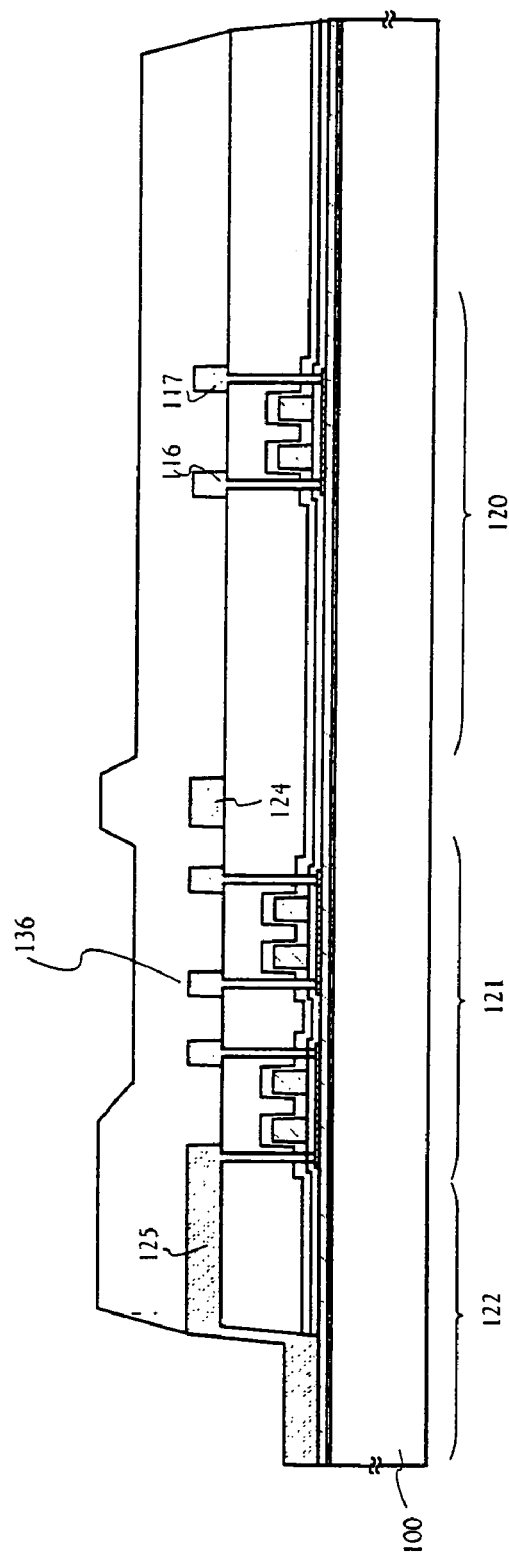
FIGS. 11A and 11B are sectional views showing the film thickness distribution after an organic resin film is formed of the present invention.
Figure 11B:
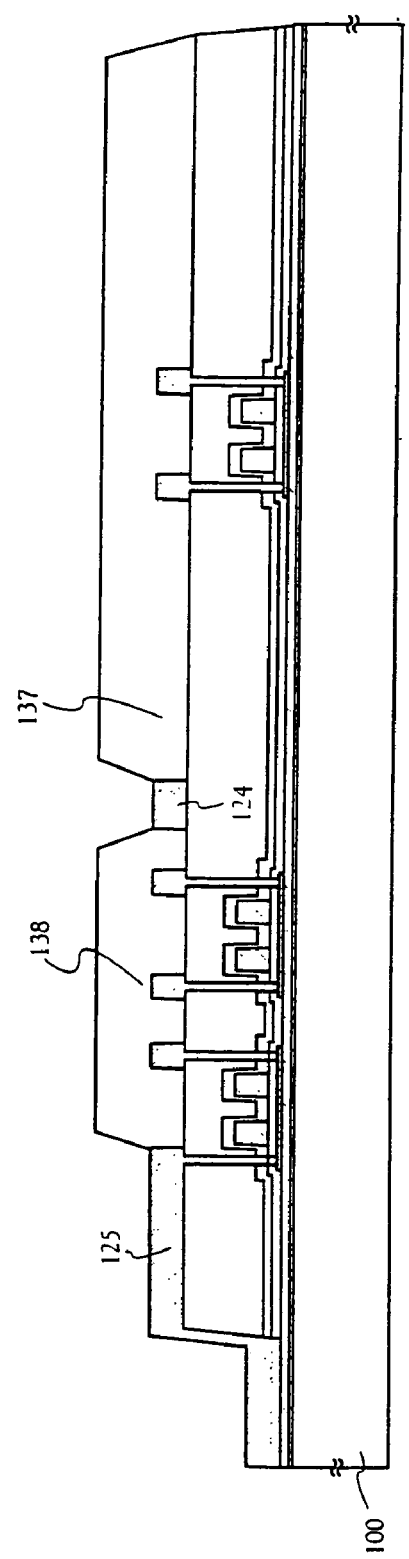
Figure 12:
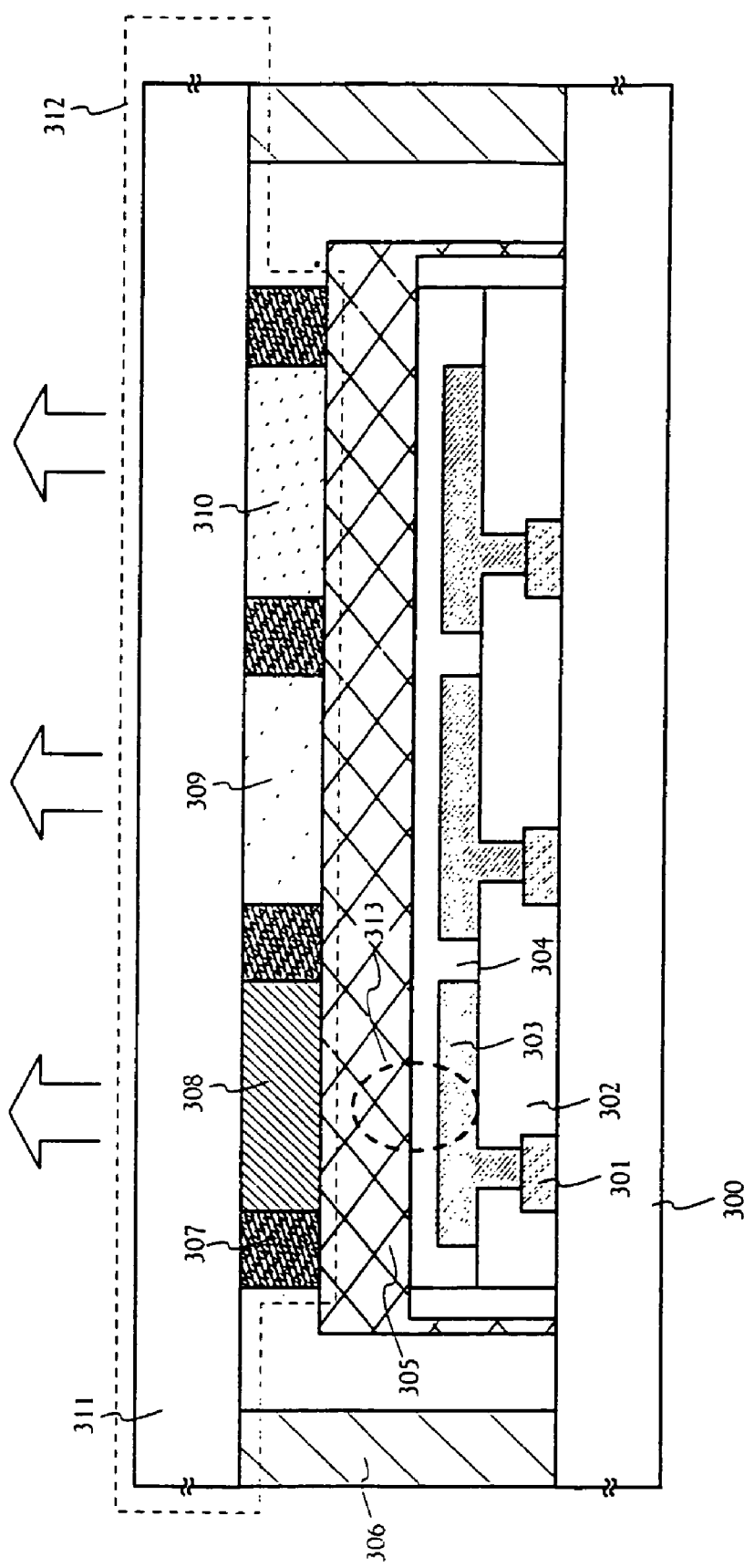
FIG. 12 is a sectional view of a conventional display device using an organic light emitting element.

FIG. 8 shows an equivalent circuit of this pixel portion. Components that are common to FIGS. 6 and 8 are denoted by the same reference symbols. The switching TFT 431 has a multi-gate structure. The current controlling TFT 434 has an LDD that overlaps a gate electrode. TFTs formed of polysilicon operate at high speed and therefore are easily degraded by hot carrier injection. Accordingly, forming in one pixel TFTs that are structured differently to suit different functions (a switching TFT with sufficiently low OFF current and a current controlling TFT strong against hot carrier injection) is very effective in manufacturing a display device of high reliability capable of excellent image display (high performance).

It is also effective to form the capacitor storage (capacitor) 433 in order to obtain high luminance display by keeping the current controlling TFT 434 conductive for continued light emission of the organic light emitting element even after the switching TFT 431 is turned unconductive from conductive.

If a time ratio gradation method in which gradation display is obtained by varying the length of light emission period of an organic light emitting element is used, the length of light emission period of an organic light emitting element is controlled by turning the reset TFT 432 conductive to make the organic light emitting element stop emitting light.

In this embodiment, the current controlling TFT 434 is an n-channel TFT and the cathode (pixel electrode) of the organic light emitting element is connected to the source of the current controlling TFT. In this way, the current flow is controlled so that a current flows from the anode (opposite electrode) side to the cathode side, and on the light emitting layer, electrons injected from the cathode are combined with holes injected from the anode to cause the organic light emitting element to emit light. On the other hand, in a structure in which an anode is connected to a current controlling TFT, a p-channel TFT is used as the current controlling TFT and the anode of the organic light emitting element is connected to the drain of the current controlling TFT so that a current flows from the anode to the cathode.

An overhanging bank structure may be employed in which the top of the bank in the vicinity of the sealing substrate 427 protrudes further than the bottom of the bank that is in contact with the second interlayer insulating film. The bank thus structured also can provide the effect of avoiding a contact between the organic light emitting element 426 and the sealing substrate 427, the effect of keeping the distance between the organic light emitting element 426 and the sealing substrate 427 constant in the pixel portion, and the effect of placing the element substrate and the sealing substrate close to each other.

Embodiment 2

A light emitting device formed by implementing the present invention can be incorporated to various electric-equipment, and a pixel portion is used as an image display portion. Given as such electronic equipment of the present invention are cellular phones, PDAs (Personal Digital Assistants), electronic books, video cameras, laptop computers, and image play back devices with the recording medium, for example, DVD (digital versatile disc), digital cameras, and the like. Specific examples of those are shown in FIGS. 9A to 10C.

FIG. 9A shows a cellular phone, which is composed of a display panel 9001, an operation panel 9002, and a connecting portion 9003. The display panel 9001 is provided with a display device 9004, an audio output portion 9005, an antenna 9009, etc. The operation panel 9002 is provided with operation keys 9006, a power supply switch 9007, an audio input portion 9008, etc. The present invention is applicable to the display device 9004.

FIG. 9B shows a mobile computer, or a portable information terminal, which is composed of a main body 9201, a camera portion 9202, an image receiving portion 9203, operation switches 9204, and a display device 9205. The present invention can be applied to the display device 9205. In such electronic devices, the display device of 3 to 5 inches is employed, however, by employing the display device of the present invention, the reduction of the weight in the portable information terminal can be attained.

FIG. 9C shows a portable book, which is composed of a main body 9301, display devices 9302 and 9303, a recording medium 9304, an operation switch 9305, and an antenna 9306, and which displays the data recorded in MD (mini disk) or DVD and the data received by the antenna. The present invention can he applied to the display devices 9302 and 9303. In the portable book, the display device of the 4 to 12 inches is employed. However, by employing the display device of the present invention, the reduction of the weight and thickness in the portable book can be attained.

FIG. 9D shows a video camera, which is composed of a main body 9401, a display device 9402, an audio input portion 9403, operation switches 9404, a battery 9405, an image receiving portion 9406, and the like. The present invention can be applied to the display device 9402.

FIG. 10A shows a personal computer, which is composed of a main body 9601, an image input portion 9602, a display device 9603, and a key board 9604. The present invention can be applied to the display device 9603.

FIG. 10B shows a player employing a recording medium with programs recorded thereon (hereinafter referred to as recording medium), which is composed of a main body 9701, a display device 9702, a speaker portion 9703, a recording medium 9704, and an operation switch 9705. The device employs DVD (digital versatile disc), CD, etc. as the recording medium so that music can be listened, movies can be seen and games and Internet can be done. The present invention can be applied to the display device 9702.

FIG. 10C shows a digital camera, which is composed of a main body 9801, a display device 9802, an eyepiece portion 9803, an operation switch 9804, and an image receiving portion (not shown). The present invention can be applied to the display device 9802.

The display device of the present invention is employed in the cellular phones in FIG. 9A, the mobile computer or the portable information terminal in FIG. 9B, the portable book in FIG. 9C, and the personal computer in FIG. 10A. The display device can reduce the power consumption of the above device by displaying white letters on the black display in a standby mode.

In the operation of the cellular phones shown in FIG. 9A, luminance is lowered when the operation keys are used, and the luminance is raised after usage of the operation switch, whereby the low power consumption can be realized. Further, the luminance of the display device is raised at the receipt of a call, and the luminance is lowered during a call, whereby the low power consumption can be realized. Besides, in the case where the cellular phone is continuously used, the cellular phone is provided with a function of turning off a display by time control without resetting, whereby the low power consumption can be realized. Note that the above operations may be conducted by manual control.

Although it is not shown here, the present invention can be applied to the display device which is employed in a navigation system, a refrigerator, a washing machine, a micro-wave oven, a telephone, a fax machine, etc. As described above, the applicable range of the present invention is so wide that the present invention can be applied to various products.

A bank provided in a pixel portion and an insulating film that is formed at the same time the bank is formed are used to control the distance between an element substrate and a sealing substrate. This makes it possible to keep the distance between the substrates short and prevent degradation of an organic light emitting element due to steam that enters the display device from its sides.

Since the sealing substrate is in contact with the tops of the bank and insulating film, the sealing substrate is above and apart from the organic light emitting element. Accordingly, dust or other projecting foreign matters on the sealing substrate are prevented from causing wiring breakable of the organic light emitting element, to thereby reduce defects such as dot defect and improve the yield.

If the display device is the type that takes out light which an organic light emitting element emits from the sealing substrate side, the bank in the pixel portion and the insulating film that is formed at the same time the bank is formed keep the distance between the organic light emitting element and the sealing substrate uniform to avoid interference fringe. Accordingly, excellent display performance with high contrast and uniform luminance is guaranteed for the display device.

If the display device is the type that uses a color filter on the sealing substrate to display a color image, a foreign matter in the color filter is prevented from causing wiring breakage of the organic light emitting element during the step of forming the color filter.

What is claimed is:

1. A method of manufacturing an active matrix display device, said active matrix display device comprising:
   a pixel portion including a plurality of pixels,
   the pixels comprising:
      an organic light emitting element including the pixel electrode, an opposite electrode, and an organic compound layer,
      wherein the pixels are separated from each other by a bank, wherein the organic compound layer is sandwiched between the pixel electrode and the opposite electrode, wherein the organic light emitting element is over an element substrate, wherein the element substrate is bonded to a sealing substrate with a seal member, wherein the sealing substrate opposes the element substrate, said method comprising the steps of:

forming the bank to cover edges of the pixel electrode;

forming the organic compound layer on the pixel electrode;

forming the opposite electrode on the organic compound layer;

forming the seal member in a periphery of the sealing substrate;

bonding the sealing substrate so that the sealing substrate is in direct contact with a top of the bank; and curing the seal member.

2. A method according to claim 1, wherein the display device is in combination with an electronic apparatus, wherein the electronic apparatus is one selected from the group consisting of a cellular phone, a mobile computer, a portable book, a video camera, a personal computer, a player employing a recording medium with programs recorded thereon and a digital camera.

3. A method according to claim 1, wherein the organic compound layer does not overlap with the top of the bank.

4. A method according to claim 1, wherein the bank is 1.5 to 10 µm in thickness.

5. A method of manufacturing an active matrix display device, said active matrix display device comprising:

a pixel portion including a plurality of pixels, the pixels comprising:

a light emitting element including the pixel electrode formed over an element substrate, an opposite electrode, a light emitting layer between the pixel electrode and the opposite electrode, and a sealing substrate opposed to and bonded to the element substrate through a seal member, wherein the pixels are separated from each other by a bank, said method comprising the steps of:

forming the bank to cover edges of the pixel electrode;

forming the light emitting layer on the pixel electrode;

forming the opposite electrode on the light emitting layer;

forming the seal member on a periphery of the sealing substrate;

bonding the sealing substrate so that the sealing substrate is in direct contact with a top of the bank; and curing the seal member, wherein a space surrounded by the element substrate, the sealing substrate, and the seal member is vacuum.

6. A method according to claim 5, wherein the display device is in combination with an electronic apparatus, wherein the electronic apparatus is one selected from the group consisting of a cellular phone, a mobile computer, a portable book, a video camera, a personal computer, a player employing a recording medium with programs recorded thereon and a digital camera.

7. A method according to claim 5, wherein the light emitting layer does not overlap with the top of the bank.

8. A method according to claim 5, wherein the bank is 1.5 to 10 µm in thickness.

9. A method of manufacturing a display device, said display device comprising:

a light emitting element including a pixel electrode formed over an element substrate, an opposite electrode, a light emitting layer between the pixel electrode and the opposite electrode, and a sealing substrate opposed to and bonded to the element substrate through a seal member, said method comprising the steps of:

forming a bank to cover edges of the pixel electrode;

forming the light emitting layer over the pixel electrode;

forming the opposite electrode over the light emitting layer;

forming a protective film in direct contact with the bank and the opposite electrode;

forming the seal member over a periphery of the sealing substrate;

bonding the sealing substrate so that the sealing substrate is in direct contact with the protective film; and curing the seal member.

10. A method according to claim 9, further comprising the step of:

forming an insulating film in the step of forming the bank;

wherein the sealing substrate is bonded in contact with the top of the bank and a top of the insulating film in the bonding step.

11. A method according to claim 10, wherein the bank and the insulating film are provided in a region where a conductive film has a width in a range of 50 µm or less.

12. A method according to claim 9, wherein the display device is in combination with an electronic apparatus, wherein the electronic apparatus is one selected from the group consisting of a cellular phone, a mobile computer, a portable book, a video camera, a personal computer, a player employing a recording medium with programs recorded thereon and a digital camera.

13. A method according to claim 9, wherein the light emitting layer does not overlap with the top of the bank.

14. A method according to claim 9, wherein the bank is 1.5 to 10 µm in thickness.

* * * * *